United States Patent
Suto

(10) Patent No.: US 12,189,002 B2
(45) Date of Patent: *Jan. 7, 2025

(54) MAGNETIC SENSOR

(71) Applicant: TDK Corporation, Tokyo (JP)

(72) Inventor: Toshihide Suto, Tokyo (JP)

(73) Assignee: TDK Corporation, Tokyo (JP)

( * ) Notice: Subject to any disclaimer, the term of this patent is extended or adjusted under 35 U.S.C. 154(b) by 147 days.

This patent is subject to a terminal disclaimer.

(21) Appl. No.: 17/743,621

(22) Filed: May 13, 2022

(65) Prior Publication Data

US 2022/0268861 A1 Aug. 25, 2022

Related U.S. Application Data

(63) Continuation of application No. 16/217,265, filed on Dec. 12, 2018, now Pat. No. 11,366,183.

(30) Foreign Application Priority Data

Dec. 27, 2017 (JP) .................. 2017-250476

(51) Int. Cl.
*G01R 33/09* (2006.01)
*G01R 33/00* (2006.01)

(52) U.S. Cl.
CPC ....... *G01R 33/093* (2013.01); *G01R 33/0017* (2013.01); *G01R 33/098* (2013.01)

(58) Field of Classification Search
CPC .............. G01R 33/093; G01R 33/0017; G01R 33/098; G01B 7/003; G01B 7/02; H10N 50/10
See application file for complete search history.

(56) References Cited

U.S. PATENT DOCUMENTS

| | | | |
|---|---|---|---|
| 11,366,183 B2* | 6/2022 | Suto | G01R 33/093 |
| 2004/0004787 A1* | 1/2004 | Matono | G11B 5/313 |
| 2009/0027809 A1 | 1/2009 | Kamijima et al. | |
| 2009/0262466 A1* | 10/2009 | Kurata | B82Y 25/00 |
| | | | 360/324 |
| 2010/0270866 A1 | 10/2010 | Ide et al. | |
| 2011/0215800 A1 | 9/2011 | Zhou et al. | |
| 2011/0273802 A1 | 11/2011 | Zhou et al. | |
| 2013/0152702 A1 | 6/2013 | Takahashi et al. | |
| 2014/0218020 A1 | 8/2014 | Zhou et al. | |
| 2015/0028863 A1 | 1/2015 | Zeyen | |
| 2015/0062756 A1 | 3/2015 | Kautzky et al. | |
| 2016/0109534 A1 | 4/2016 | Dieny et al. | |
| 2016/0266218 A1 | 9/2016 | Tanabe | |

(Continued)

FOREIGN PATENT DOCUMENTS

| | | | |
|---|---|---|---|
| JP | S61-196419 A | 8/1986 | |
| JP | H11-087804 A | 3/1999 | |

(Continued)

*Primary Examiner* — Paresh Patel
(74) *Attorney, Agent, or Firm* — Posz Law Group, PLC

(57) ABSTRACT

A magnetic sensor according to the invention has a magnetoresistive element having a multi-layer structure and a magnetically sensitive axis, and at least a soft magnetic body that is arranged near the magnetoresistive element. The soft magnetic body has a sloping line at least at a corner thereof, wherein the sloping line is tilted with respect to two sides of the soft magnetic body that extend to the corner, as viewed in a stacking direction of the magnetoresistive element.

22 Claims, 21 Drawing Sheets

(56) References Cited

U.S. PATENT DOCUMENTS

| | | | |
|---|---|---|---|
| 2016/0313122 A1 | 10/2016 | Bhattacharyya et al. | |
| 2016/0377691 A1* | 12/2016 | Paci | G01R 33/0011 324/252 |
| 2017/0328963 A1 | 11/2017 | Schmitt et al. | |
| 2019/0128700 A1* | 5/2019 | Uchida | G01R 33/09 |

FOREIGN PATENT DOCUMENTS

| | | |
|---|---|---|
| JP | 2015-219227 A | 12/2015 |
| JP | 2016-170028 A | 9/2016 |
| WO | 2016/078793 A1 | 5/2016 |

\* cited by examiner

MAGNETIC SENSOR

CROSS REFERENCE TO RELATED APPLICATIONS

The present application is a continuation application of U.S. Utility application Ser. No. 16/217,265 filed on Dec. 12, 2018, which is based on, and claims priority from, JP Application No. 2017-250476, filed on Dec. 27, 2017, the contents of which are incorporated herein by reference.

FIELD OF THE INVENTION

The present invention relates to a magnetic sensor.

DESCRIPTION OF THE RELATED ART

As a sensor for detecting the position of a moving object, a magnetic sensor that has an element having a magnetoresistive effect is known (see JPH11-87804). A magnetic sensor moves relative to a magnet and thereby detects a change in an external magnetic field that is generated by the magnet, and calculates the moving distance of the moving object based on the change in the external magnetic field that is detected.

The magnetic sensor disclosed in JPH11-87804 has a giant magnetoresistive thin film having a magnetoresistive effect and a pair of soft magnetic thin films, as disclosed in FIG. 1 thereof. The giant magnetoresistive thin film of this magnetic sensor is elongate, and the soft magnetic thin films are arranged on both sides of the giant magnetoresistive thin film with regard to the long axis thereof. Each soft magnetic thin film is rectangular, as viewed in the film thickness direction of the giant magnetoresistive thin film. In other words, every corner of each soft magnetic thin film has an edge (a pointed part), as viewed in the film thickness direction of the giant magnetoresistive thin film. In this magnetic sensor, a giant magnetoresistive thin film having poor sensitivity to a magnetic field is combined with soft magnetic thin films in order to enhance the sensitivity to a magnetic field.

SUMMARY OF THE INVENTION

In the magnetic sensor disclosed in JPH11-87804, in which the soft magnetic thin films are arranged on both sides of the giant magnetoresistive thin film, a magnetic field that is directed in a direction other than the direction of the magnetically sensitive axis of the giant magnetoresistive thin film is considerably shielded. However, a magnetic sensor is desired that is improved in shielding performance of a magnetic field that is directed in a direction other than the direction of the magnetically sensitive axis.

The present invention aims at providing a magnetic sensor having a soft magnetic body that, when the magnetic body is used as a shield, effectively shields a magnetic field that is directed in a direction other than the direction of the magnetically sensitive axis and that, when the magnetic body is used as a yoke, has small hysteresis.

A magnetic sensor according to the present invention comprises: a magnetoresistive element having a multi-layer structure and a magnetically sensitive axis; and at least a soft magnetic body that is arranged near the magnetoresistive element. The soft magnetic body has a sloping line at least at a corner thereof, wherein the sloping line is tilted with respect to two sides of the soft magnetic body that extend to the corner, as viewed in a stacking direction of the magnetoresistive element.

According to the magnetic sensor of the present invention, when the magnetic body is used as a shield, the magnetic body effectively shields a magnetic field that is directed in a direction other than the direction of the magnetically sensitive axis, and when the magnetic body is used as a yoke, the magnetic body has small hysteresis.

The above and other objects, features and advantages of the present invention will become apparent from the following descriptions with reference to the accompanying drawings which illustrate examples of the present invention.

DETAILED DESCRIPTION OF EMBODIMENTS

Explanation will be given about first to fifth embodiments, as well as modifications of the embodiments. In the following descriptions, "end portion" means "end portion with regard to the long axis thereof" unless otherwise defined.

First Embodiment

Magnetic sensor 10 (see FIGS. 1A to 1D) of the present embodiment is, for example, a sensor for detecting a position of moving object (not shown) having a magnet, that is, a positon sensor. Magnetic sensor 10 of the present embodiment is configured to move relative to the above-mentioned magnet and thereby to detect a change in the external magnetic field that is detected. Magnetic sensor 10 of the present embodiment has a magnetically sensitive axis, which is the Y axis (see FIG. 1A etc.), described later, and detects a change in the magnetic field in the Y axis direction (hereinafter sometimes referred to as an "aligning direction"). In the following descriptions, the Z axis direction (see FIG. 1A) (hereinafter sometimes referred to as a "film thickness direction") corresponds to the stacking direction of each element portion 20, described later, and the X axis direction (see FIG. 1A) corresponds to a direction that is perpendicular both to the Z axis direction and to X axis direction.

Magnetic sensor 10 of the present embodiment is used, for example, for a lens position detecting mechanism that constitutes an auto focus mechanism or an optical shake correction mechanism of a camera of a mobile information terminal and the like.

Figure 1A:
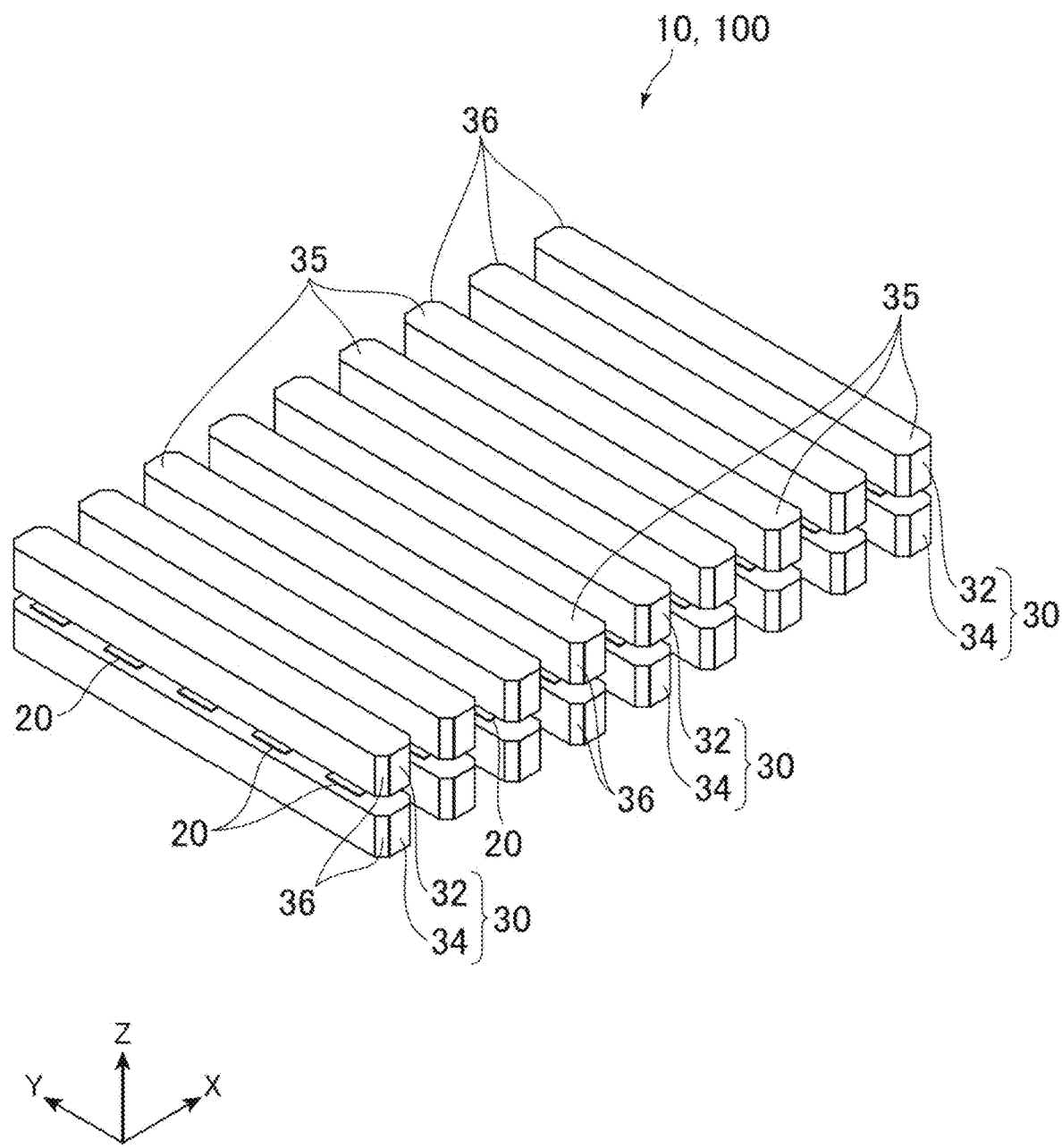
FIG. 1A is a perspective view of the main portion of a magnetic sensor according to a first embodiment.
Figure 1B:
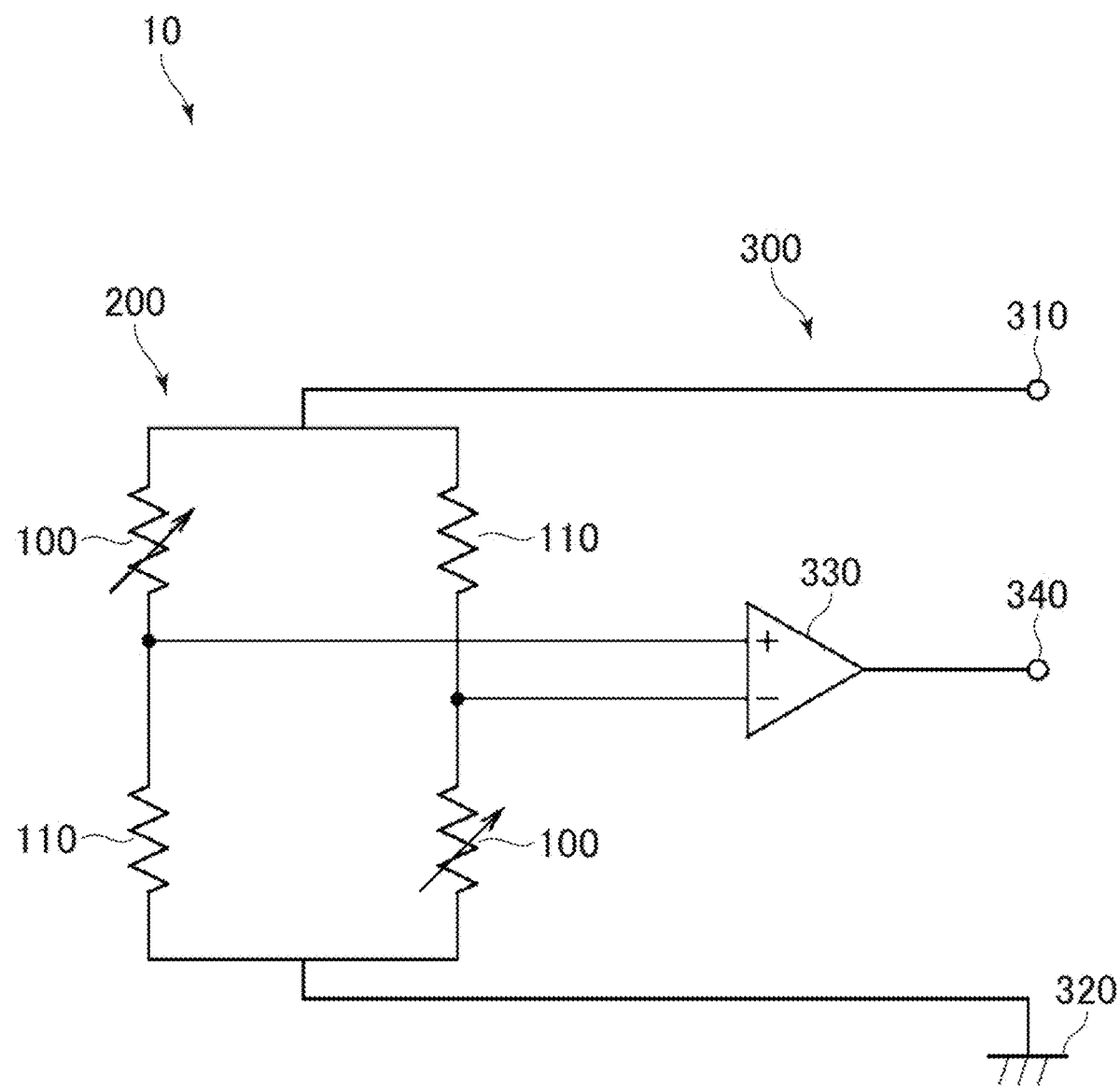
FIG. 1B is a circuit diagram of the magnetic sensor according to the first embodiment.

Magnetic sensor 10 of the present embodiment has magnetoresistive element portion 100 that is constructed by a plurality of element portions 20 (an example of a magnetoresistive element), a plurality of upper shields 32 (an example of a soft magnetic body) and a plurality of lower shields 34 (another example of the soft magnetic body), as shown in FIGS. 1A and 1B. Upper shield 32 and lower shield 34 form a pair of shields 30, as described later. A plurality of pairs of shields 30 is provided, and the pairs of shields 30 are arranged in the X axis direction in an orientation described later (see FIG. 1A).

As shown in FIG. 1B, magnetic sensor 10 of the present embodiment has sensor portion 200, in which magnetoresistive element portions 100 and resistor elements 110 are bridge-connected to each other, and integrated circuit 300 having input terminal 310 that is electrically connected to sensor portion 200, ground terminal 320, differential amplifier 330 and external output terminal 340 etc.

Each element portion 20 of the present embodiment has a film configuration in which films are stacked (an arrangement of stacked films), as described later (see FIG. 1C).

Here, the Z axis direction is an example of the stacking direction. Each element portion 20 has a magnetoresistive effect, described later.

In an example, a plurality of element portions 20 forms a group in which element portions 20 are arranged in the Y axis direction at a predetermined interval (see FIG. 1A). A plurality of the groups is provided and the groups are arranged in the X axis direction at a predetermined interval. In each group that is formed of a plurality of element portions 20, element portions 20 that are adjacent to each other are connected to each other by an electrode (not shown), and a combination of each group and each electrode forms a meander shape. Further, a combination of each group and each electrode is connected to another combination that is adjacent to the former in the X axis direction via an electrode (not shown). Accordingly, element portions 20 of the present embodiment are connected in series by a plurality of electrodes.

The groups, each formed of a plurality of element portions 20, are arranged in the X axis direction at a predetermined interval in the embodiment, as described above, but may be arranged in a direction other than the X axis direction.

Figure 1C:
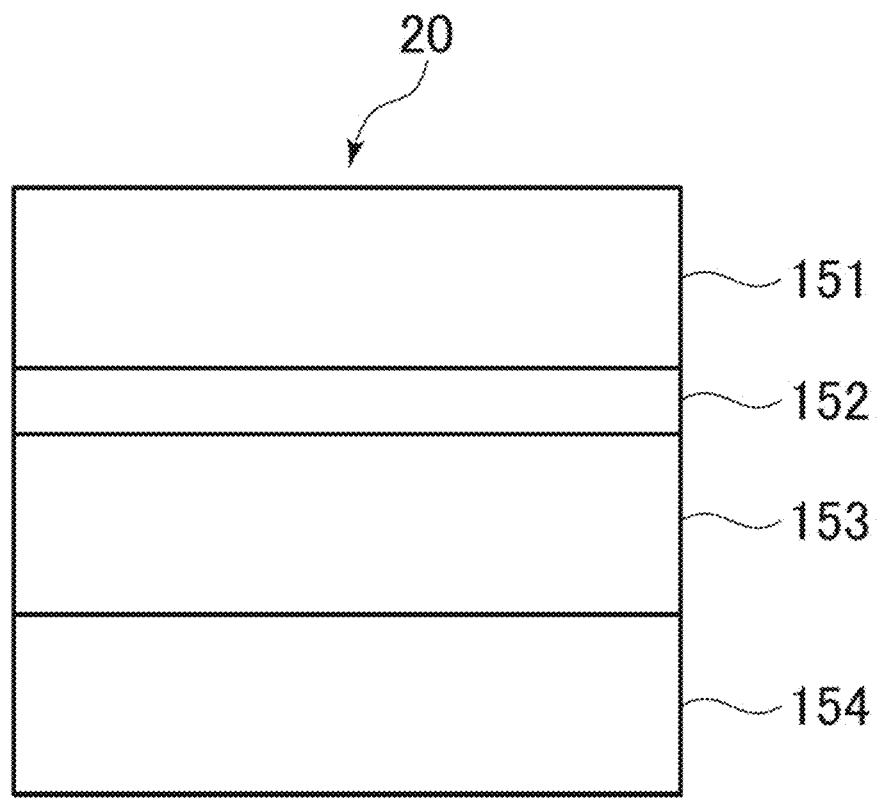
FIG. 1C is a sectional view of an element portion that constitutes the main portion of the magnetic sensor according to the first embodiment.

Each element portion 20 of the present embodiment has, for example, a typical spin-valve type film configuration, as shown in FIG. 1C. Specifically, each element portion 20 includes free layer 151 whose magnetization direction is changed depending on an external magnetic field, pinned layer 153 whose magnetization direction is pinned relative to the external magnetic field, spacer layer 152 that is positioned between and that is in contact both with free layer 151 and with pinned layer 153, antiferromagnetic layer 154 that is adjacent to pinned layer 153 on the back side thereof, as seen from spacer layer 152. Free layer 151, spacer layer 152, pinned layer 153 and antiferromagnetic layer 154 are stacked above a substrate (not shown). Antiferromagnetic layer 154 fixes the magnetization direction of pinned layer 153 by the exchange coupling with pinned layer 153. Pinned layer 153 may also have a synthetic structure in which two ferromagnetic layers sandwich a nonmagnetic intermediate layer. Spacer layer 152 is a tunneling barrier layer that is formed of a nonmagnetic insulator, such as $Al_2O_3$. Accordingly, each element portion 20 of the present embodiment is a tunneling magnetoresistive element (a TMR element) having a tunneling magnetoresistive effect. A TMR element is advantageous in that it has a larger MR ratio and a larger output voltage from the bridge circuit than a GMR element.

A pair of shields 30 of the present embodiment is arranged near each element portion 20 and has a function of shielding a magnetic field in the X axis direction (absorbing an external magnetic field that is applied in the X axis direction). A pair of shields 30 consists of upper shield 32 that is arranged on the upper side of element portion 20 and lower shield 34 that is arranged on the lower side of element portion 20, as shown in FIG. 1A. In one example, lower shield 34 has the same shape as upper shield 32. Upper shield 32 and lower shield 34 are elongate and are arranged such that the long axis thereof extend in the Y axis direction and former overlaps with the latter, as viewed in the Z axis direction. In the present embodiment, the Y axis direction corresponds to a direction of the long axes of upper shield 32 and lower shield 34, and the X axis direction corresponds to a direction of the short axes of upper shield 32 and lower shield 34. Upper shield 32 and lower shield 34 are rectangular, as viewed in the Z axis direction. Upper shield 32 and lower shield 34 are arranged on the upper side and on the lower side of each group of element portions 20 that are arranged in the Y axis direction, respectively, such that upper shield 32 and lower shield 34 sandwich each group of element portions 20. The pairs of shields 30 sandwich the respective groups that are arranged in the X axis direction. Each upper shield 32 and lower shield 34 is formed, for example, of NiFe, CoFe, CoFeSiB, CoZrNb and the like.

Accordingly, the pairs of shields 30 that are arranged in the X axis direction absorb a magnetic field in the X axis direction in order to shield a magnetic field in the X axis direction that is applied to the area where element portions 20 are arranged.

Next, referring to FIGS. 1A and 1D, explanation will be given about the shapes of both end portions 35 of upper shield 32 and lower shield 34 of the present embodiment. In the following descriptions, explanation will be given on upper shield 32 because lower shield 34 has the same shape as upper shield 32 and is formed of the same material as upper shield 32, as described above. Regarding lower shield 34, refer to the following explanation of upper shield 32. One of both end portions 35 and the other are in line symmetry regarding an imaginary line that extends in the X axis direction, as viewed in the Z axis direction. Thus, the illustration of the other of end portions 35 is omitted in FIG. 1D.

As described above, each upper shield 32 is rectangular, as viewed in the Z axis direction (see FIG. 1A). Each upper shield 32 is shaped such that each corner 36, that is, four corners 36, is chamfered, as viewed in the Z axis direction. In the present descriptions, a shape with chamfering is referred to as a chamfered shape. In other words, each corner 36 of each upper shield 32 has a shape of so-called C-chamfering or 45° chamfering that looks as if it would be formed by removing apex portion 37 that originally existed (the isosceles triangle portion that is defined by the dot-dash lines and the real line of corner 36 in FIG. 1D. Also see FIG. 2.), as viewed in the Z axis direction. In other words, each upper shield 32 has a sloping line that is tilted with respect to two sides 30X, 30Y (described later) of upper shield 32 that extend to corner 36, as viewed in the Z axis direction. In the present description, the sloping line may be used interchangeably with corner 36, and the sloping line may be referred to as sloping line 36. It should be noted that each shield 32, 34 of the present embodiment has the same shape as each shield 32, 34, as viewed in the Z axis direction, at any section that is perpendicular to the Z axis direction.

Chamfering area S of apex portion 37, as viewed in the Z axis direction, is S1 (μm²) or more and S2 (μm²) or less. In the present embodiment, S1 is 1.0×10⁻³, and S2 is 2.5×10. Chamfering area S is calculated in the following manner. Suppose that the long side of upper shield 32 is side 30Y (an example of an arbitrary line), a short side of upper shield 32 is side 30X (an example of another line that is inclined relative to the arbitrary line) and an intersection of an extension of side 30Y and an extension of side 30X is intersection IS, as seen in the Z axis direction in FIG. 1D. Here, "inclined relative to the arbitrary line" means "not parallel to the arbitrary line". Further, suppose that an imaginary line that is a part of the extension of side 30Y and that connects side 30Y to intersection IS is imaginary line 30YA. Suppose that an imaginary line that is a part of the extension of side 30X and that connects side 30X to intersection IS is imaginary line 30(A. Suppose that the area of a region that is surrounded by imaginary line 30YA, imaginary line 30XA and corner 36, as viewed in the Z axis direction, is chamfering area S. As mentioned above, each shield 32, 34 is octagonal with four corners 36 chamfered at angles of 45°, as viewed in the Z axis direction. Thus, each corner has angles of 135° or an obtuse angle, as viewed in the Z axis direction. Accordingly, each shield 32, 34 of the present embodiment has a shape having an obtuse angle on at least a part of the circumference thereof, as viewed in the Z axis direction. It should be noted that side 30Y is an example of an arbitrary line and side 30X is an example of another line that is inclined relative to the arbitrary line in the embodiment, but side 30X may be an example of an arbitrary line and side 30Y may be an example of another line that is inclined relative to the arbitrary line. It should also be noted that an arbitrary line is a long side and another line is a short side and vice versa in the embodiment, but other arrangements are also possible. For example, both an arbitrary line and another line have the same length.

Next, the effects of the present embodiment (the first and second effects) will be described with reference to the drawings. In the explanation, the present embodiment will be compared to a first comparative example (See FIG. 2), as needed, and when the same elements are used in the first comparative example as in the present embodiment, the names and reference numerals in the present embodiment will be used.

Figure 1D:
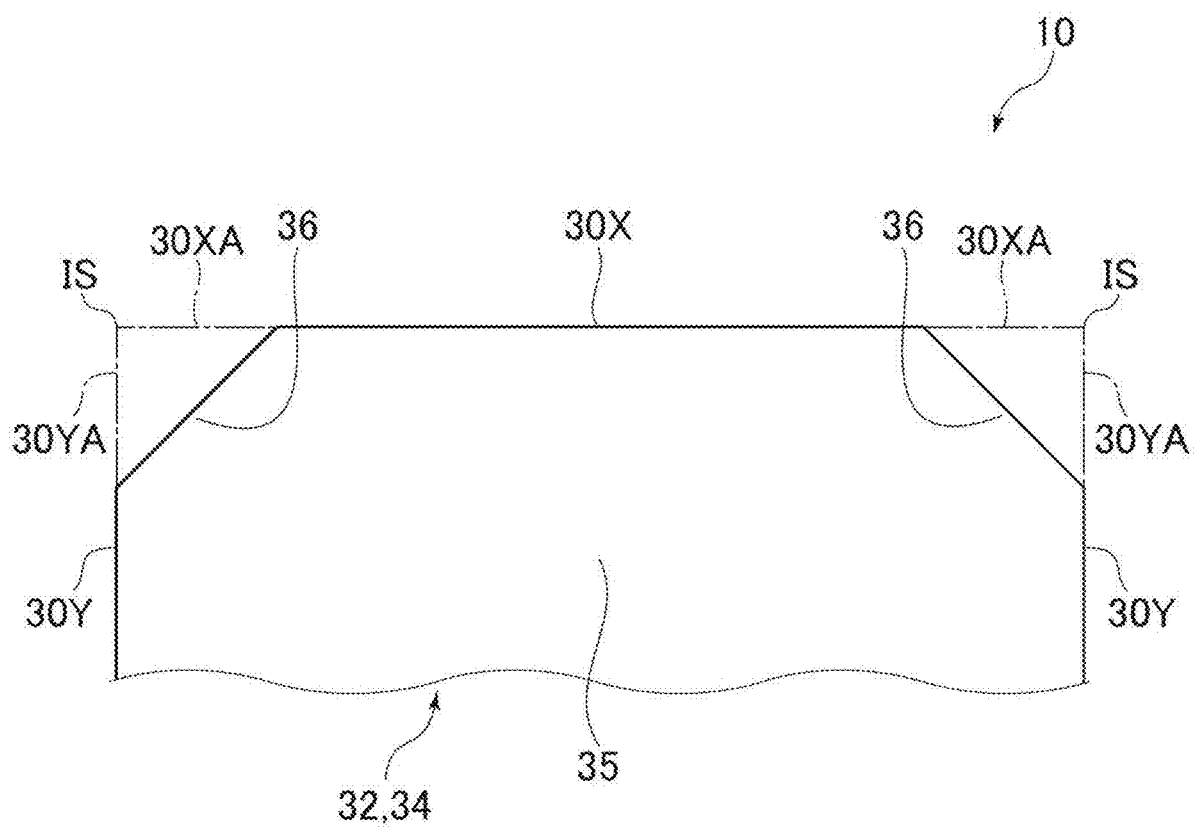
FIG. 1D is an enlarged view of an end portion of the soft magnetic body with regard the long axis thereof, wherein the soft magnetic body constitutes the magnetic sensor according to the first embodiment.

The first effect is obtained by the chamfered shape of at least one corner 36 of upper shield 32 or lower shield 34 (see FIGS. 1A and 1D). The first effect will be explained by comparing the present embodiment to the first comparative example (See FIG. 2), described later. The same elements in the first comparative example as in the present embodiment will be referred to by the names and reference numerals in the present embodiment.

Figure 2:
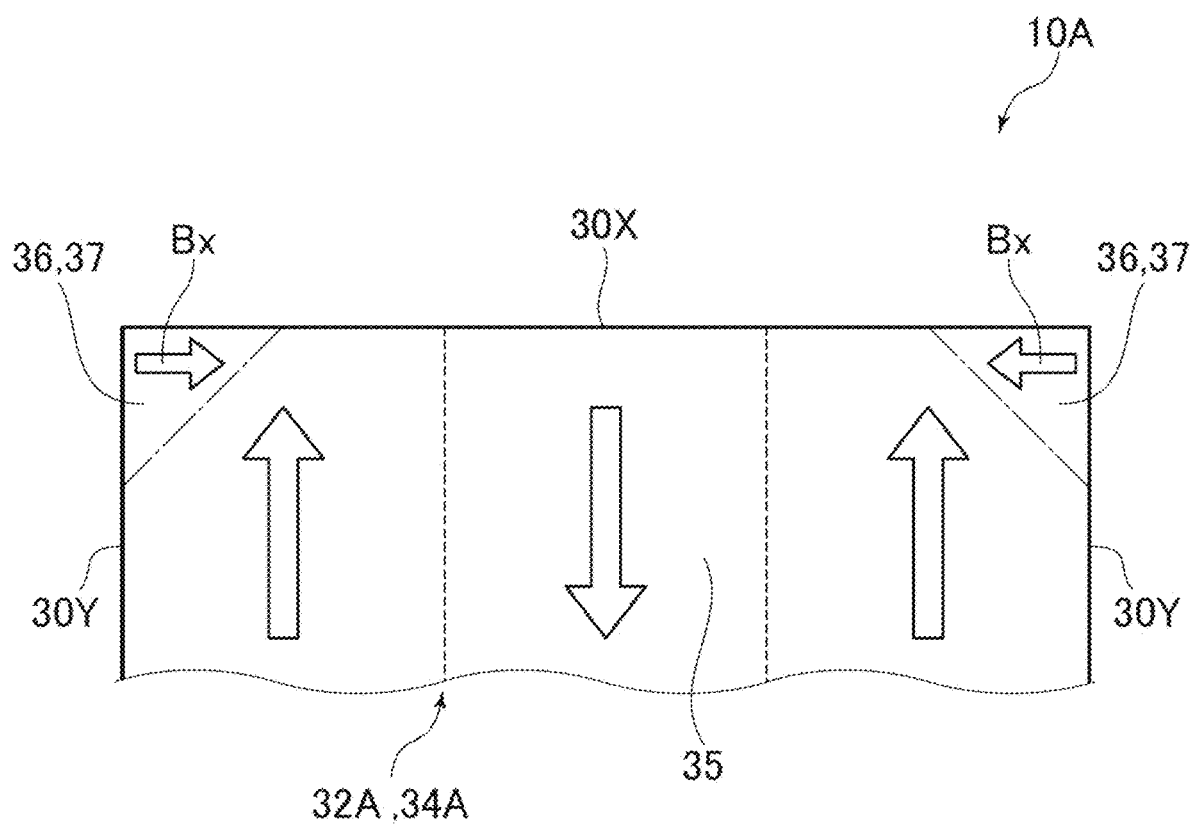
FIG. 2 is an enlarged view of an end portion of the soft magnetic body with regard the long axis thereof, wherein the soft magnetic body constitutes a magnetic sensor according to a first comparative embodiment.

In each shield 32A, 34A of magnetic sensor 10A of the first comparative example, any corner 36 is not chamfered and every corner 36 has apex portion 37 (See FIG. 2). Magnetic sensor 10A of the first comparative example is the same as magnetic sensor 10 of the present embodiment except for the above.

In magnetic sensor 10A of the first comparative example, unstable magnetic field component Bx that is directed in the X axis direction occurs at the edge of end portion 35, as shown in FIG. 2. In other words, magnetic domains are generated along a direction in which a magnetic field is to be shielded by each shield 32A, 34A. As a result, in magnetic sensor 10A of the first comparative example, the capability of shielding a magnetic field of each shield 32, 34 deteriorates due to the unstable magnetic field component Bx.

In contrast, in each shield 32, 34 (see FIGS. 1A and 1D) of magnetic sensor 10 of the present embodiment, each corner 36 is formed into a chamfered shape that does not have a portion that correspond to apex portion 3, as compared to each shield 32A, 34A of the first comparative example (See FIG. 2). In other words, each shield 32, 34 of the present embodiment does not have apex portion 37, as compared to each shield 32A, 34A of the first comparative example.

Accordingly, in magnetic sensor 10 of the present embodiment, unstable magnetic field component Bx that occurs in magnetic sensor 10A of the first comparative example does not occur or is less likely to occur. As a results, magnetic sensor 10 of the present embodiment has higher capability of shielding a magnetic field in directions other than the direction of the magnetically sensitive axis than magnetic sensor 10A of the first comparative example. In the present embodiment, each corner 36 of each shield 32, 34 is chamfered. Thus, the present embodiment has higher capability of shielding a magnetic field in directions other than the direction of the magnetically sensitive axis than an arrangement in which a part of corners 36 of each shield 32, 34 are chamfered but the other corners have apex portions 37.

The second effect is obtained by setting chamfering area S of corners 36 of each shield 32, 34 to be S1 ($\mu m^2$) or more and S2 ($\mu m^2$) or less, as viewed in the Z axis direction. Here, S1 is $1.0\times10^{-3}$, and S2 is $2.5\times10$. The second effect will be explained by comparing the present embodiment to second and third comparative examples (not shown), described later. The same elements that are used in the second and third comparative examples as used in the present embodiment will be referred to by the names and reference numerals in the present embodiment.

The second comparative example is different from the present embodiment in that chamfering area S of each shield is less than S1 ($\mu m^2$). The third comparative example is different from the present embodiment in that chamfering area S of each shield is larger than S2 ($\mu m^2$). Here, S1 is $1.0\times10^{-3}$, and S2 is $2.5\times10$. The magnetic sensors according to the second and third comparative examples have the same configuration as magnetic sensor 10 of the present embodiment except for the above.

Figure 3A:
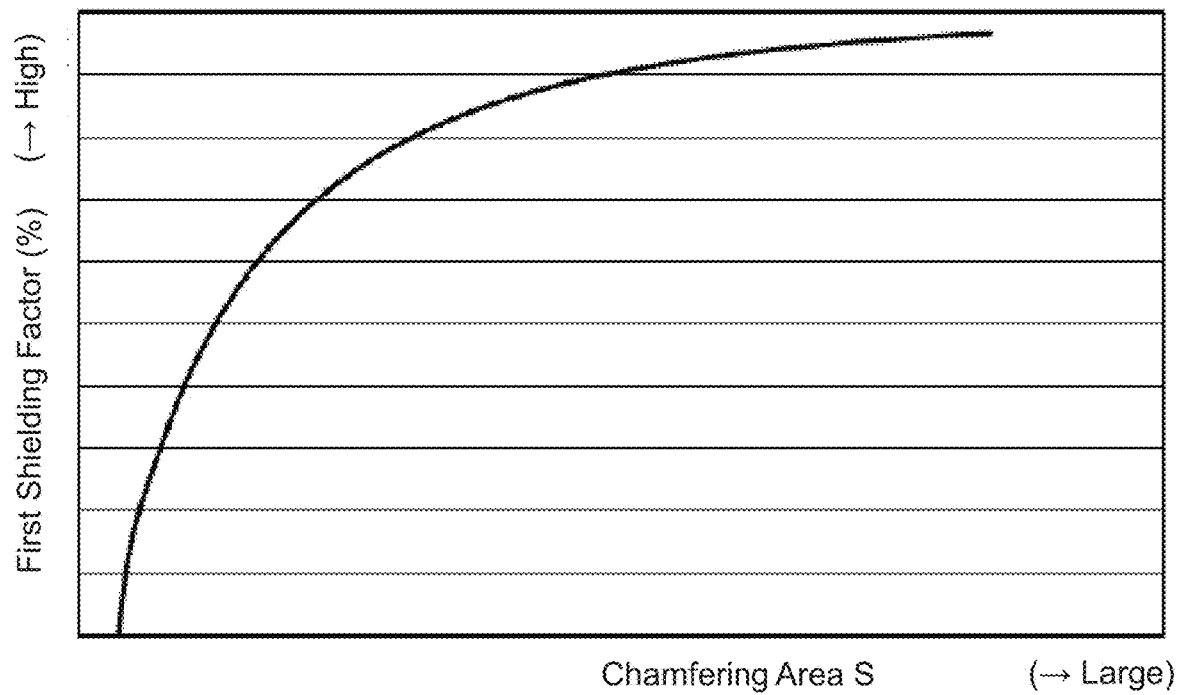
FIG. 3A is a graph showing a relationship between a chamfering area and a shielding factor of a magnetic field in the X axis direction that is caused by unnecessary magnetic domains.

FIG. 3A is a graph showing a relationship between chamfering area S and a shielding factor of a magnetic field of each shield 32, 34 in the X axis direction (hereinafter referred to as a first shielding factor), wherein the magnetic field is caused by unnecessary magnetic domains (the regions that generate magnetic field component Bx, mentioned above). As will be understood from the graph of FIG. 3A, the larger chamfering area S is, or to be more precise, the larger the volume of chamfering area S as viewed in the Z axis direction is, or the larger the area of the unnecessary magnetic domains (or to be more precise, the volume of the unnecessary magnetic domains) is, the higher is the first shielding factor. Here, the X axis direction corresponds to a direction in which a magnetic field is to be shielded in magnetic sensor 10 of the present embodiment.

Figure 3B:
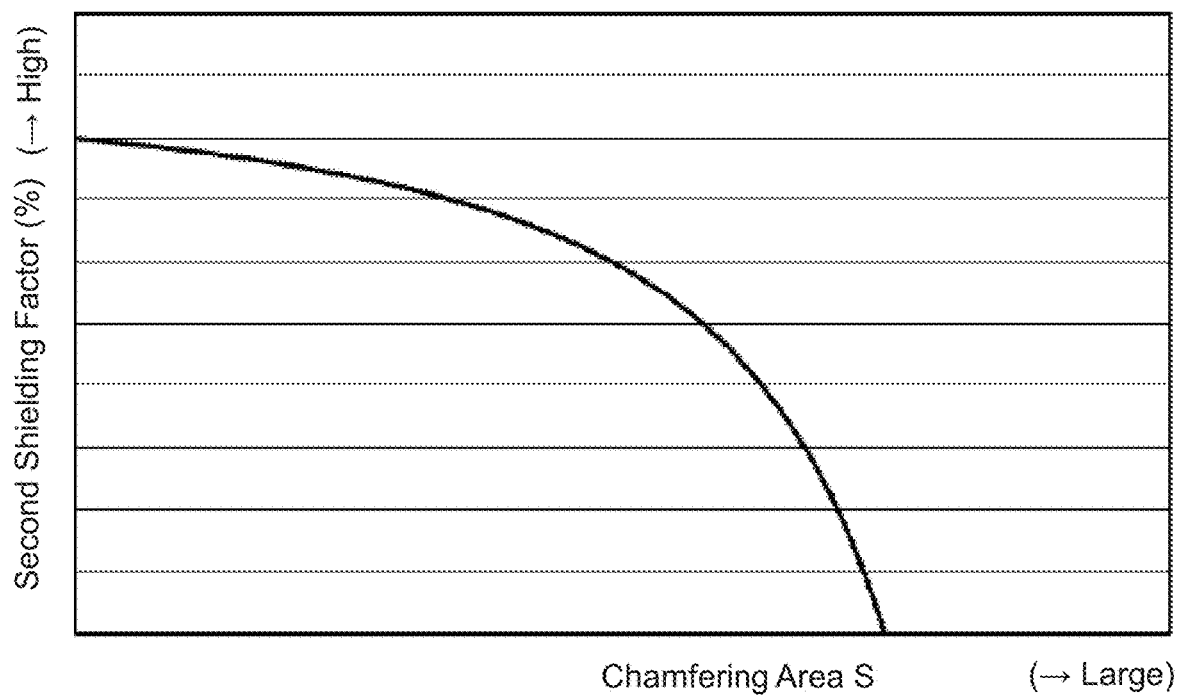
FIG. 3B is a graph showing a relationship between the chamfering area and the shielding factor of a magnetic field in the X axis direction, wherein the magnetic field is caused by the volume of an end portion of a soft magnetic body with regard the long axis thereof.

In contrast, FIG. 3B is a graph showing a relationship between chamfering area S and a shielding factor of a magnetic field of each shield 32, 34 in the X axis direction (hereinafter referred to as a second shielding factor), which depends on the area of end portion 35 of each shield 32, 34 (as viewed in the Z axis direction). As will be understood from the graph of FIG. 3B, the larger chamfering area S is, or to be more precise, the larger the volume of chamfering area S as viewed in the Z axis direction is, the lower is the second shielding factor.

Figure 3C:
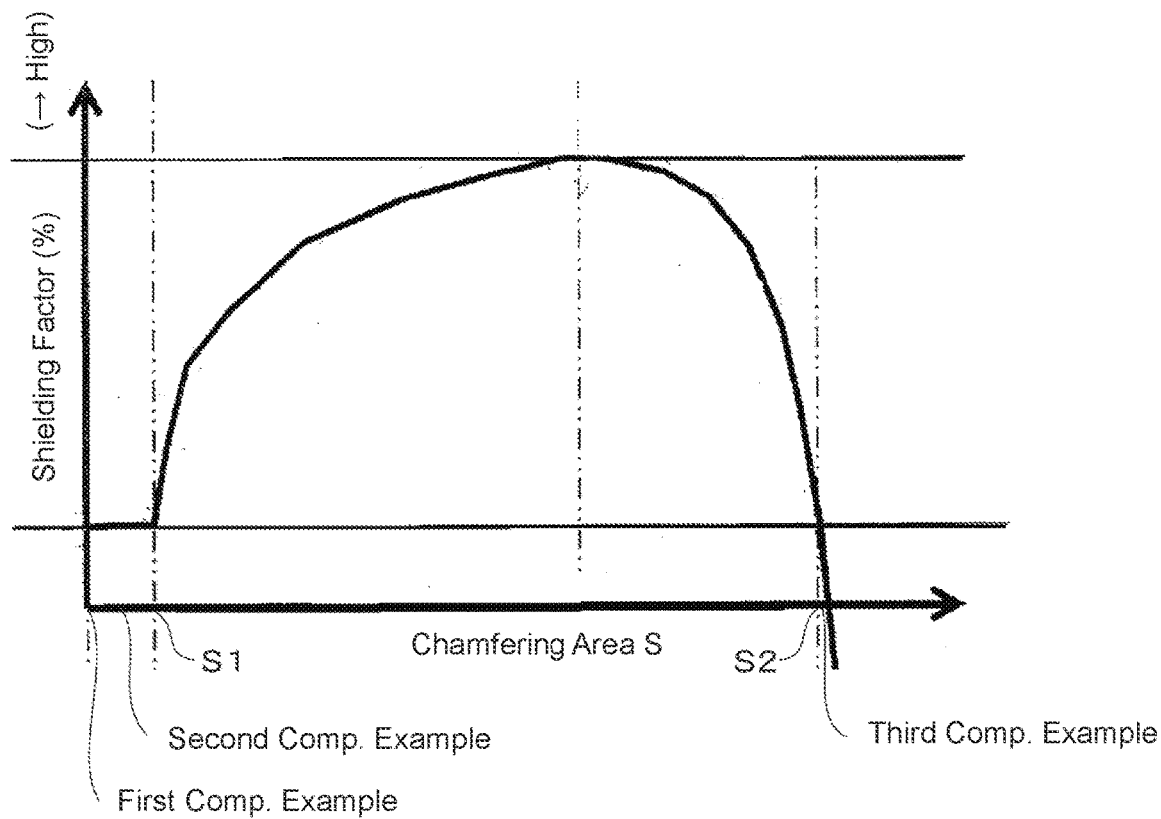
FIG. 3C is a graph showing a relationship between the chamfering area and a combined (that is, calculated from the graphs of FIGS. 3A and 3B) shielding factor of a magnetic field in the X axis direction.

FIG. 3C is a graph showing a relationship between chamfering area S and the first shielding factor and the second shielding factor. In other words, FIG. 3C is a combination of the graphs of FIGS. 3A and 3B, showing a relationship between chamfering area S and a shielding factor of a magnetic field in the X axis direction. Referring to FIG. 3C, the shielding factors of the first comparative example (See FIG. 2, chamfering area S=0), the second comparative example (chamfering area S<S1) and the third comparative example (S2<chamfering area S) are lower than the shielding factor of the present embodiment (S1<=chamfering area S<=52). Here, S1 is $1.0\times10^{-3}$, and S2 is $2.5\times10$.

Accordingly, magnetic sensor 10 of the present embodiment is capable of more effectively shielding a magnetic field in directions other than the direction of the magnetically sensitive axis than the first to third comparative examples.

Figure 4:
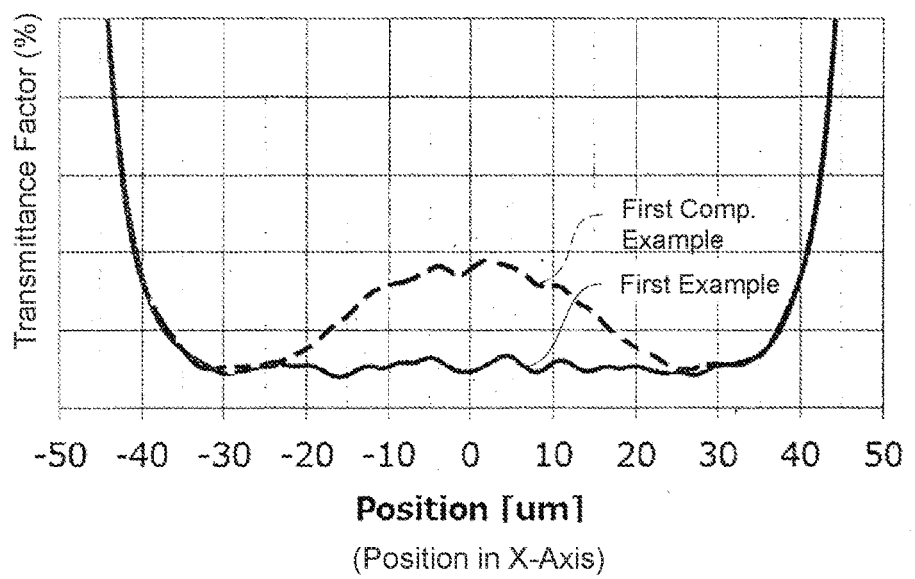
FIG. 4 is a graph showing a transmittance rate of a magnetic field in the X axis direction at different positions of the soft magnetic body in the X axis direction in the first embodiment and in the first comparative example.

FIG. 4 is a graph showing a simulation result of a transmittance rate of a magnetic field at different positions of each shield 32, 34 in the X axis direction in the present embodiment (see FIG. 1D) and a transmittance rate of a magnetic field at different positions of a soft magnetic body in the X axis direction in the first comparative example (See FIG. 2). As will be understood from the graph of FIG. 4, the present embodiment shows a lower transmittance rate of a magnetic field at the center of the short side of each shield 32, 34 than the first comparative example. Accordingly, the present embodiment is capable of more effectively shielding a magnetic field in directions other than the direction of the magnetically sensitive axis than the first comparative example. The inventor believes that this difference is cause by existence/nonexistence and the size of the above-mentioned unnecessary magnetic domains.

Second Embodiment

Next, referring to FIGS. 5A and 5B, magnetic sensor 10B of the second embodiment will be explained. In the following descriptions, differences between the present embodiment and the first embodiment will be explained. When the same elements are used in the present embodiment as in the first embodiment, the names and reference numerals in the first embodiment will be used.

Figure 5A:
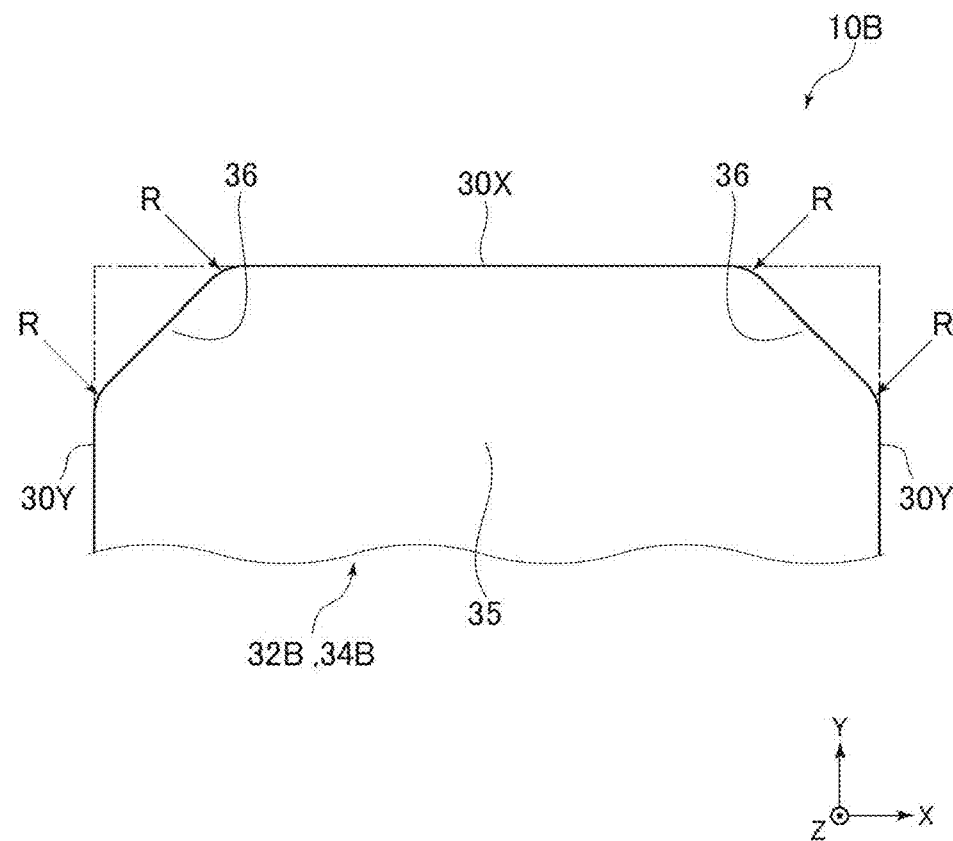
FIG. 5A is an enlarged view of an end portion of a soft magnetic body with regard the long axis thereof, wherein the soft magnetic body constitutes a magnetic sensor according to the second embodiment.

As shown in FIG. 5A, in each shield 32B, 34B (another example of the soft magnetic body) of magnetic sensor 10B of the present embodiment, connecting parts of corner 36 of the first embodiment that connect corner 36 to long side 30Y and short side 30X and that is C-chamfered are R-chamfered (indicated by R in the figure) (see FIG. 1D). In other words, the circumference of corner 36 of the present embodiment is formed of a combination of a curved line that corresponds to a R-chamfered part and a straight line that corresponds to a C-chamfered part, that is, a straight line and two curved lines that are connected to both ends of the straight line, respectively, as viewed in the Z axis direction. Since each shield 32B, 34B has the above-mentioned connecting parts along a part of the circumference, each shield 32B, 34B has a circumference that is at least partly formed of curved lines, as viewed in the Z axis direction. Magnetic sensor 10B of the present embodiment has the same configuration as magnetic sensor 10 of the first embodiment except for the above.

Figure 5B:
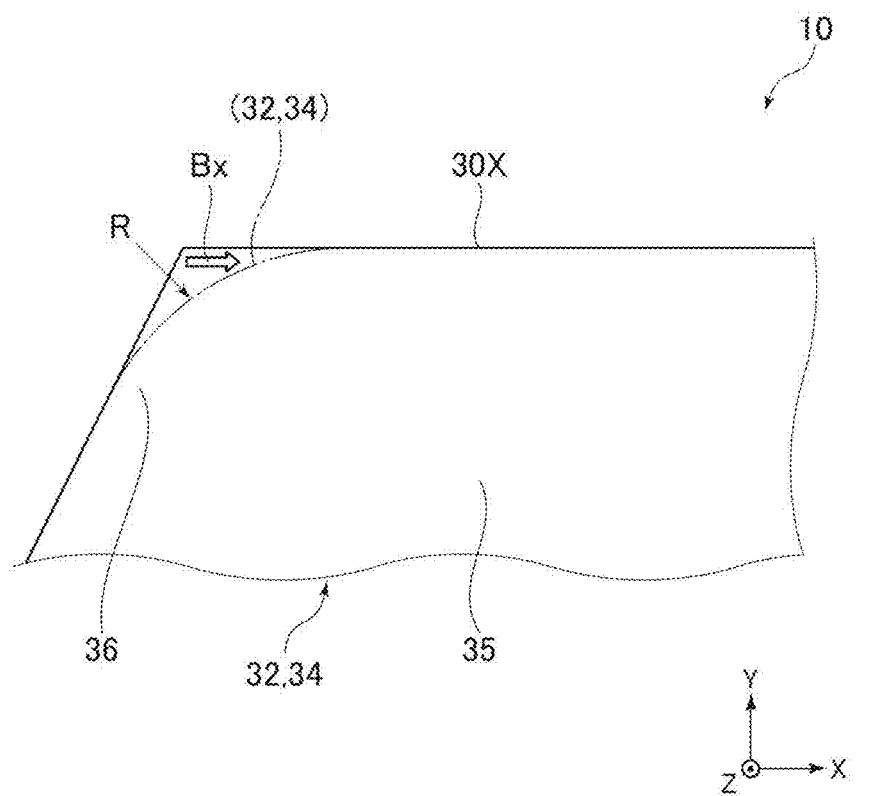
FIG. 5B is an enlarged view of an end portion of a soft magnetic body with regard the long axis thereof in the first embodiment, illustrating magnetic domains of a portion that the first embodiment has but the second embodiment does not have.

FIG. 5B is an enlarged view of end portion 35 of each shield 32, 34 of the first embodiment, as viewed in the Z axis direction. In each shield 32, 34 of the first embodiment, in which corner 36 is C-chamfered, sharp edges (magnetic domains) remain at the connecting parts that connect corner 36 to long side 30Y and short side 30X. Such magnetic domains may cause unstable magnetic field component Bx.

In contrast, such magnetic field component Bx does not occur in the present embodiment because there is no sharp edge in corners 36, as described above.

Accordingly, magnetic sensor 10B of the present embodiment is capable of more effectively shieling a magnetic field in directions other than the direction of the magnetically sensitive axis than magnetic sensor 10A according to the first embodiment.

Third Embodiment

Next, referring to FIG. 6, magnetic sensor 10C of a third embodiment will be explained. In the following descriptions, differences between the present embodiment and the first embodiment will be explained. When the same elements are used in the present embodiment as in the first embodiment, the names and reference numerals in the first embodiment will be used.

In each shield 32C, 34C (another example of the soft magnetic body) of magnetic sensor 10C of the present embodiment, corners 36, which are C-chamfered in the first embodiment, are R-chamfered. In other words, the circumference of corners 36 of the present embodiment is formed of curved lines that correspond to R chamfering (indicated by arrows R), as viewed in the Z axis direction. Since each shield 32B, 34B has curved lines that correspond to the above-mentioned R chamfering along a part of the circumference, each shield 32B, 34B has a circumference that is at least partly formed by curved lines, as viewed in the Z axis direction. Magnetic sensor 10C of the present embodiment has the same configuration as magnetic sensor 10 of the first embodiment except for the above.

The present embodiment has the same effect as the first and second embodiments.

Fourth Embodiment

Next, referring to FIGS. 7A and 7B, magnetic sensor 10D of the fourth embodiment will be explained. In the following descriptions, differences between the present embodiment and the first embodiment will be explained. When the same elements are used in the present embodiment as in the first embodiment, the names and reference numerals in the first embodiment will be used.

Figure 7A:
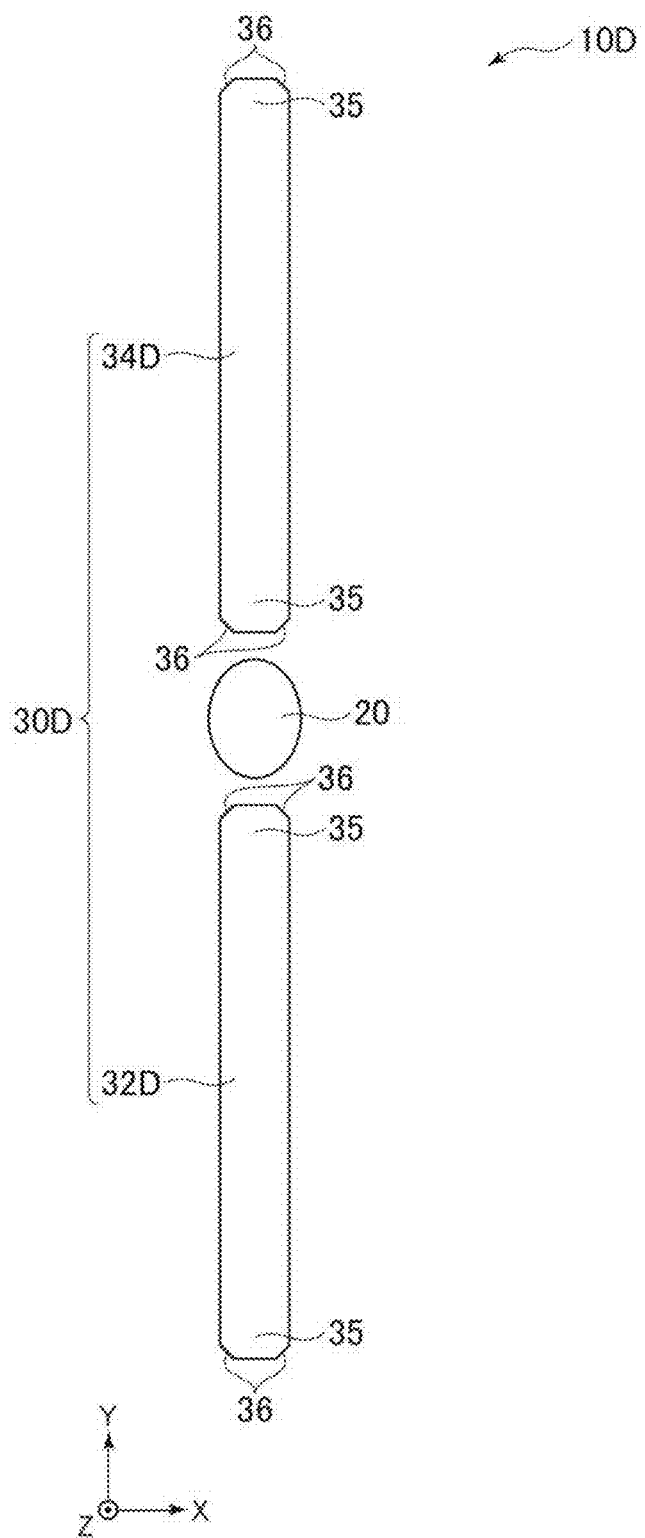
FIGS. 7A and 7B are a plan view and a side view of the main portion of a magnetic sensor according to a fourth embodiment, respectively.
Figure 7B:
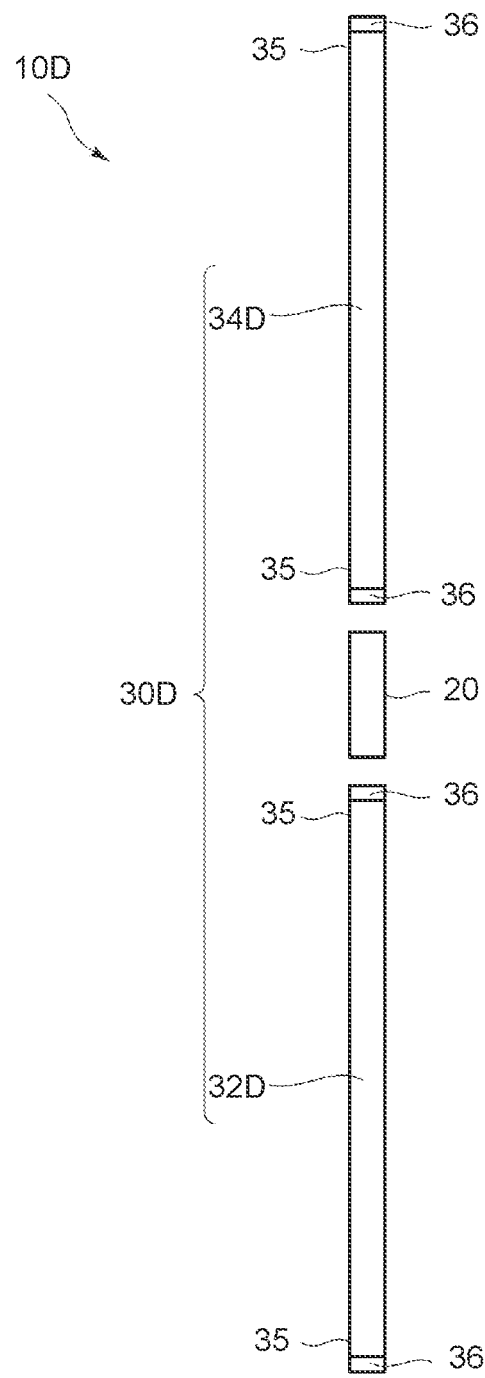

Magnetic sensor 10D of the present embodiment has element portion 20 and a pair of yokes 30D (yoke 32D, 34D), as shown in FIGS. 7A and 7B. Each yoke 32D, 34D (another example of the soft magnetic body) has the same shape as upper shield 32 mentioned above (see FIGS. 1A and 1D) and is formed of the same material as upper shield 32 mentioned above. Each yoke 32D, 34D is arranged in the Y axis direction such that the long axis thereof is parallel to the Y axis direction and such that yokes 32D, 34D sandwich element portion 20. The magnetically sensitive axis of element portion 20 is directed in the Y axis direction. In other words, element portion 20 of the present embodiment has a magnetically sensitive axis in a direction that crosses the Z axis direction, which is the stacking direction thereof, or, more specifically, in a direction that is substantially perpendicular to the Z axis direction. In the present embodiment, the Y axis direction corresponds to the long axis of each yoke 32D, 34D, and the X axis direction corresponds to a direction parallel to the short axis of each yoke 32D, 34D. Each yoke 32D, 34D of the present embodiment collects magnetic field in the Y axis direction and guides the magnetic field that is collected in the Y axis direction. Magnetic sensor 10D of the present embodiment has the same configuration as magnetic sensor 10 of the first embodiment except for the above. As will be understood from the above, each yoke 32D, 34D has an obtuse angle on at least a part of the circumference thereof, as viewed in the Z axis direction.

Next, the effect of the present embodiment will be described with reference to FIGS. 8A to 8C. The effect of the present embodiment is obtained by chamfering corners 36 of each yoke 32D, 34D, as viewed in the Z axis direction, and by setting chamfering area S to be S1 ($\mu m^2$) or more and S2 ($\mu m^2$) or less. Here, S1 is $1.0 \times 10^{-3}$, and S2 is $2.5 \times 10$. The effect of the present embodiment will be explained by comparing the present embodiment to fourth to sixth comparative examples (not shown) described later. When the same elements are used in the present embodiment as in the fourth to sixth comparative examples, the names and reference numerals in the present embodiment will be used.

In the fourth comparative example, each yoke is the same as each shield 32A, 34A (See FIG. 2) of the first comparative example. In other words, the corners of each yoke of the fourth comparative example do not have chamfered shapes. The fifth comparative example is different from the present embodiment in that chamfering area S of each yoke is smaller than S1 ($\mu m^2$). The sixth comparative example is different from the present embodiment in that chamfering area S of each yoke is larger than S2 ($\mu m^2$). Here, S1 is $1.0 \times 10^{-3}$, and S2 is $2.5 \times 10$. The magnetic sensors according to the fourth to sixth comparative examples have the same configuration as magnetic sensor 10D of the present embodiment except for the above.

Figure 8A:
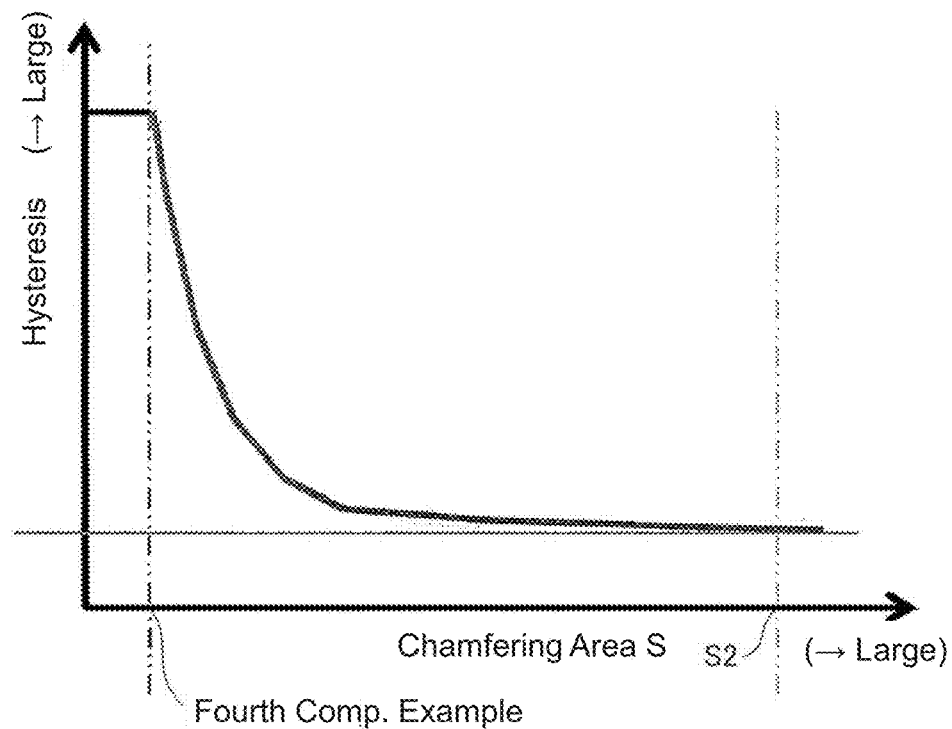
FIG. 8A is a graph showing a relationship between a chamfering area and a hysteresis value.

FIG. 8A is a graph showing a relationship between chamfering area S and a hysteresis value. In other words, the graph of FIG. 8A shows a hysteresis value that is caused by unnecessary magnetic domains. The hysteresis value is a value that is proportional to an area of a region that is surrounded by a hysteresis curve. The smaller a hysteresis value is, the better is the performance of a magnetic sensor. As shown in the graph of FIG. 8A, the smaller chamfering area S is, the larger is the hysteresis value. The inventor believes that this is because unstable magnetic field component Bx (See FIG. 2) that is caused by the unnecessary magnetic domains easily occurs as chamfering area S becomes small.

Figure 8B:
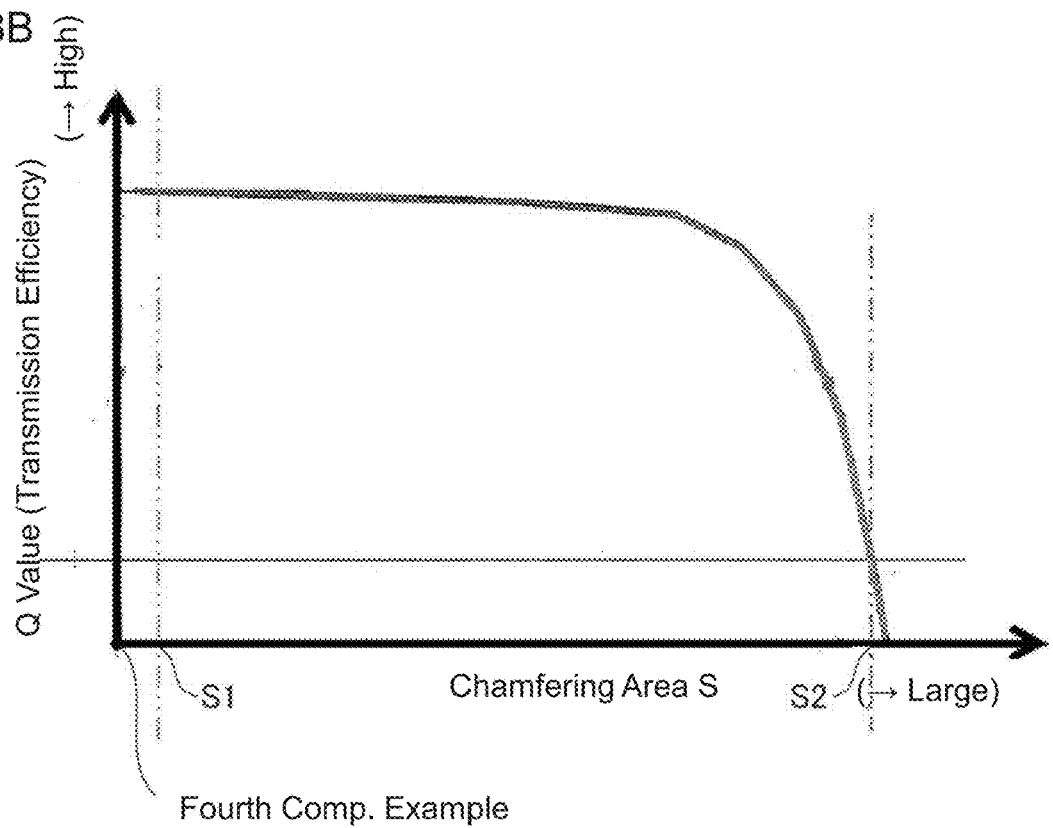
FIG. 8B is a graph showing a relationship between a chamfering area and a Q-value (energy transforming efficiency)

FIG. 8B is a graph showing a relationship between chamfering area S and energy transforming efficiency (a Q-value) of a magnetic field that is collected by each yoke. As seen in the graph of FIG. 8B, the larger chamfering area S is, or the smaller the area of end portion 35, the lower is the Q-value.

Figure 8C:
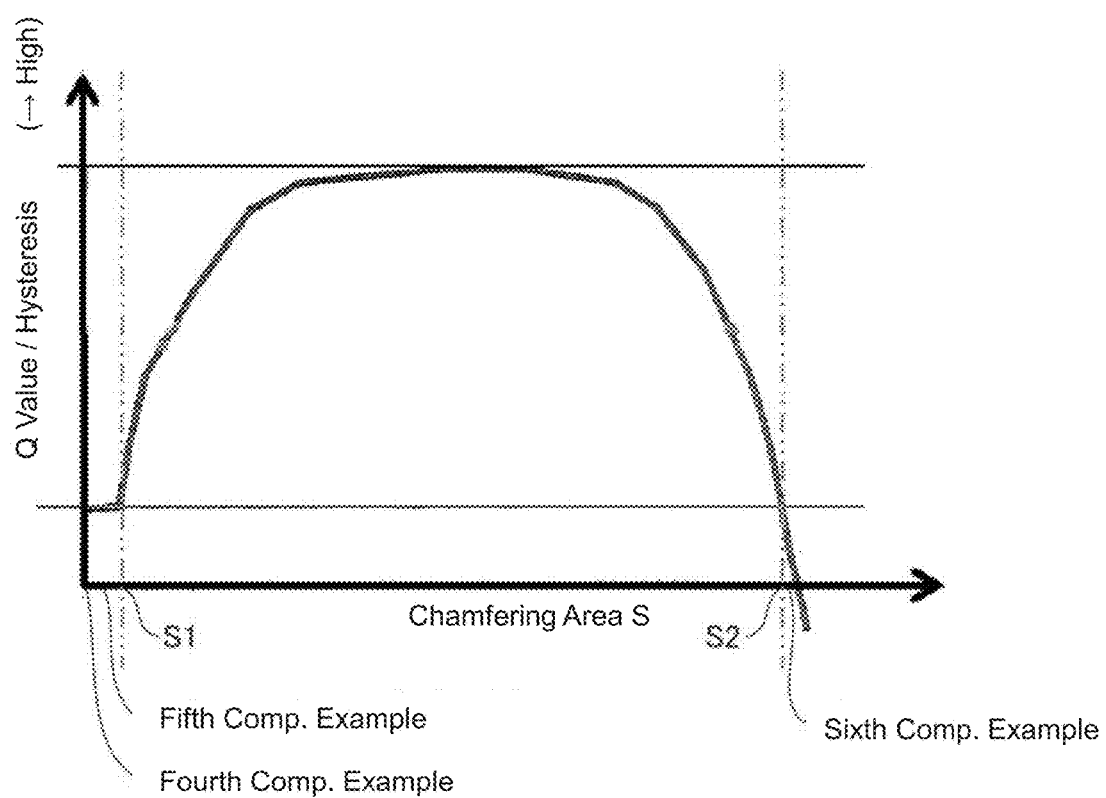
FIG. 8C is a graph showing a relationship between a chamfering area and a Q-value/a hysteresis value.

FIG. 8C is a graph showing a relationship between chamfering area S and the Q-value/the hysteresis value. As will be found from FIG. 8C, the Q-value/the hysteresis value of the fourth comparative example (chamfering area S=0), the Q-value/the hysteresis value of the fifth comparative example (chamfering area S<S1) and the Q-value/the hysteresis value of the sixth comparative example (S2<chamfering area S) are smaller than the Q-value/the hysteresis value of the present embodiment (51<=chamfering area S<=52). Here, S1 is $1.0 \times 10^{-3}$, and S2 is $2.5 \times 10$.

Accordingly, magnetic sensor 10D of the fourth embodiment is capable of reducing a hysteresis value, while keeping a Q-value, as compared to the fourth to sixth comparative examples. As a result, magnetic sensor 10D of the present embodiment is capable of enhancing linearity of the hysteresis curve while keeping a Q-value.

Modification of the Fourth Embodiment

Figure 6:
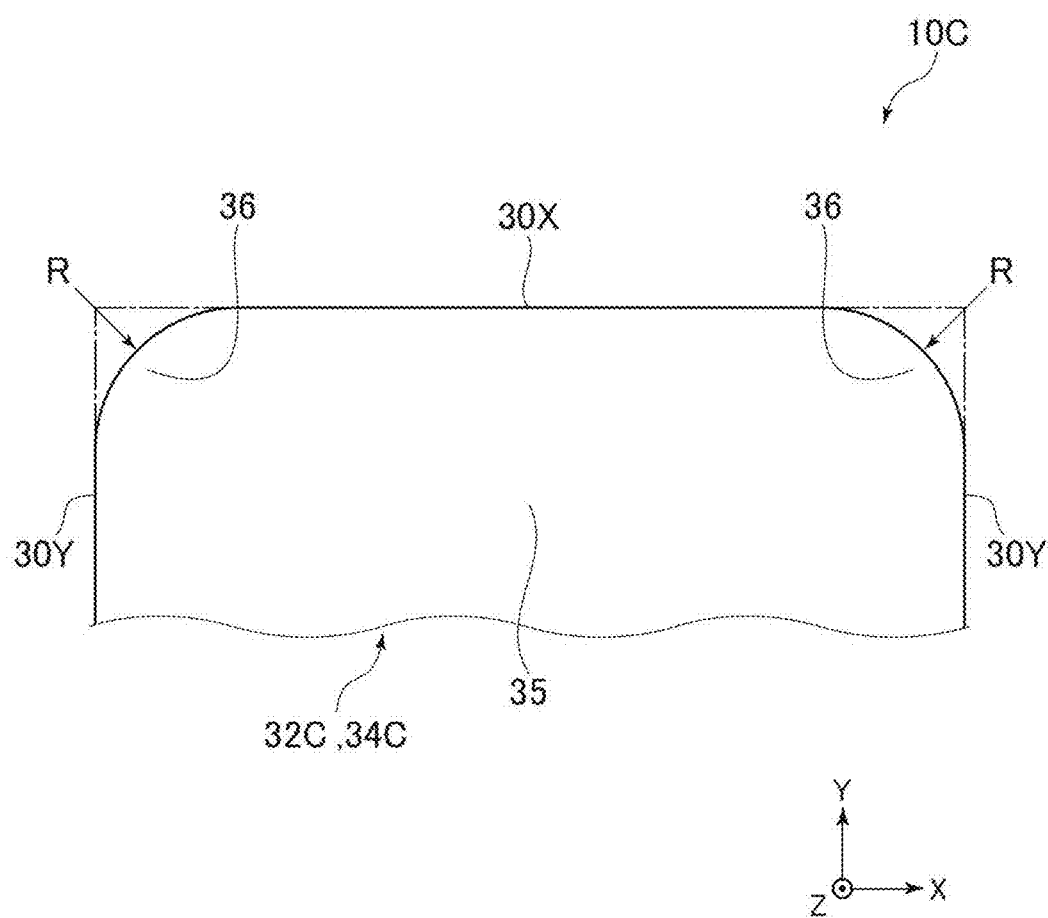
FIG. 6 is an enlarged view of an end portion of a soft magnetic body with regard to a direction parallel to long sides thereof, wherein the soft magnetic body constitutes a magnetic sensor according to a third embodiment.

Each yoke 32D, 34D of the present embodiment has the same shape as the shield of the first embodiment, as described above, but may have the same shape as the shield of the second embodiment (see FIG. 5A) or the third embodiment (see FIG. 6). End portion 35 of each yoke of the modification has a shape as shown in FIG. 5A (the circumference of corner 36 is formed of a combination of curved lines and a straight line, as viewed in the Z axis direction) or a shape as shown in FIG. 6 (the circumference of corner 36 is formed of a curved line, as viewed in the Z axis direction). Therefore, unstable magnetic field component Bx (see FIG. 5B) that is caused by the unnecessary magnetic domains is less likely to occur.

Accordingly, the modification of the fourth embodiment is capable of further limiting a hysteresis value, as compared to the fourth embodiment. As a result, the modification of the fourth embodiment is capable of further enhancing the linearity of the hysteresis curve.

Fifth Embodiment

Next, referring to FIGS. 9A and 9B, magnetic sensor 10E of the fifth embodiment will be explained. In the following descriptions, differences between the present embodiment and the fourth embodiment will be explained. When the same elements are used in the present embodiment as in the fourth embodiment, the names and reference numerals in the fourth embodiment will be used.

Figure 9A:
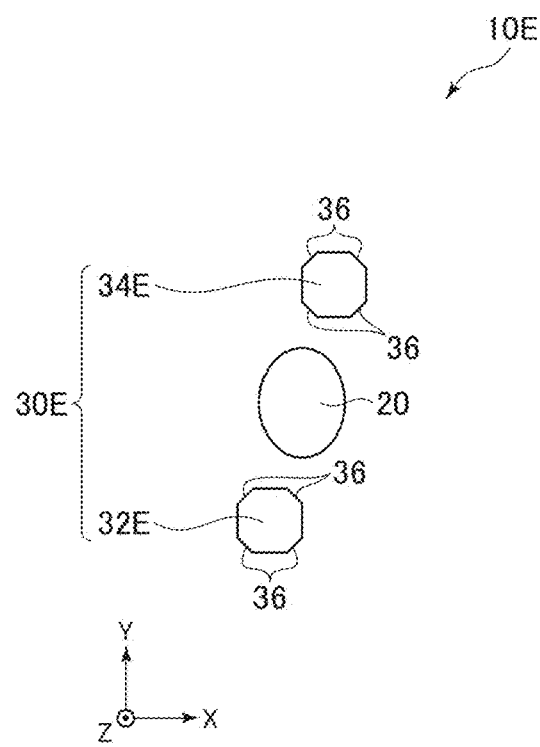
FIGS. 9A and 9B are a plan view and a side view of the main portion of a magnetic sensor according to a fifth embodiment, respectively.
Figure 9B:
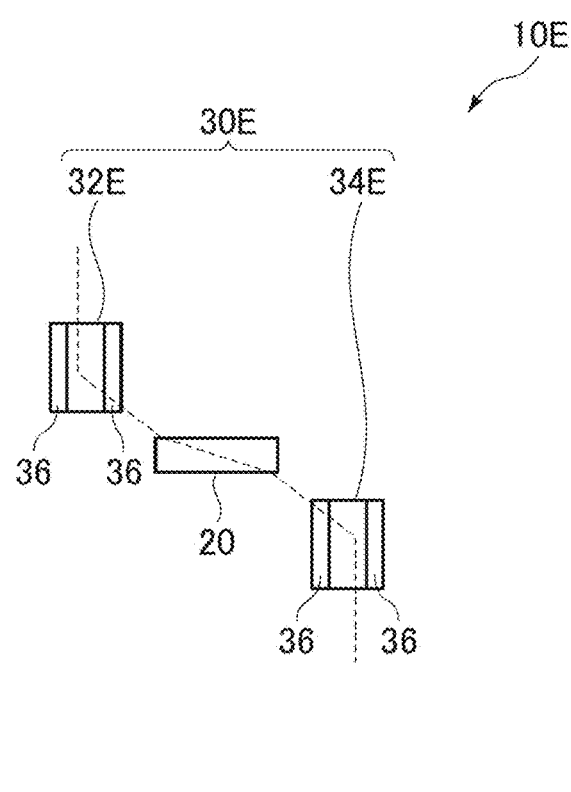

Magnetic sensor 10E of the present embodiment has element portion 20 and a pair of yokes 30E (yokes 32E, 34E), as shown in FIGS. 9A and 9B. Each yoke 32E, 34E (another example of the soft magnetic body) is formed of the same material as above-mentioned upper shield 32 (see FIGS. 1A and 1D). Each yoke 32E, 34E is a cuboid that is square with four corners chamfered, as viewed in the Z axis direction, and that is rectangular with long axis extending in the Z axis direction, as viewed in the X axis direction or in the Y axis direction. Yoke 34E is arranged at a predetermined position downstream of yoke 32E both in the X axis direction and in the Y axis direction, as viewed in the Z axis direction (see FIG. 9A). Yokes 32E, 34E sandwich element portion 20, as viewed in the Z axis direction. The magnetically sensitive axis of element portion 20 is directed in the Y axis direction. Yoke 32E is arranged on the upper side of element portion 20 with regard to the Z axis direction and yoke 34E is arranged on the lower side of element portion 20 with regard to the Z axis direction, as viewed in the X axis direction (see FIG. 9B). Each yoke 32E, 34E of the present embodiment collects a magnetic field in the Z axis direction and guides the magnetic field that is collected in the Y axis direction. Magnetic sensor 10E of the present embodiment has the same configuration as magnetic sensor 10D of the fourth embodiment except for the above.

As will be understood from the above, each yoke 32D, 34D has an obtuse angle on at least a part of the circumference thereof, as viewed in the Z axis direction. In the present embodiment, it is also possible to form corners 36 into the shape of the second embodiment (see FIG. 5A) or the third embodiment (see FIG. 6) (modification of the fifth embodiment) in the same manner as the fourth embodiment is modified.

The present embodiment has the same effect as the fourth embodiment.

The present invention has been described by using the embodiments (first to fifth embodiments and the modifications), but the present invention is not limited to these. For example, the following embodiments (modifications) are also included in the scope of the present invention.

For example, in each embodiment, upper shield 32 and lower shield 34 shield a magnetic field in the X axis direction, that is, in a direction of the short sides thereof. However, upper shield 32 and lower shield 34 may shield a magnetic field in the Y axis direction, that is, in a direction of the long sides thereof, and it is needless to say that such a configuration is also included in the scope of the present invention.

Figure 10A:
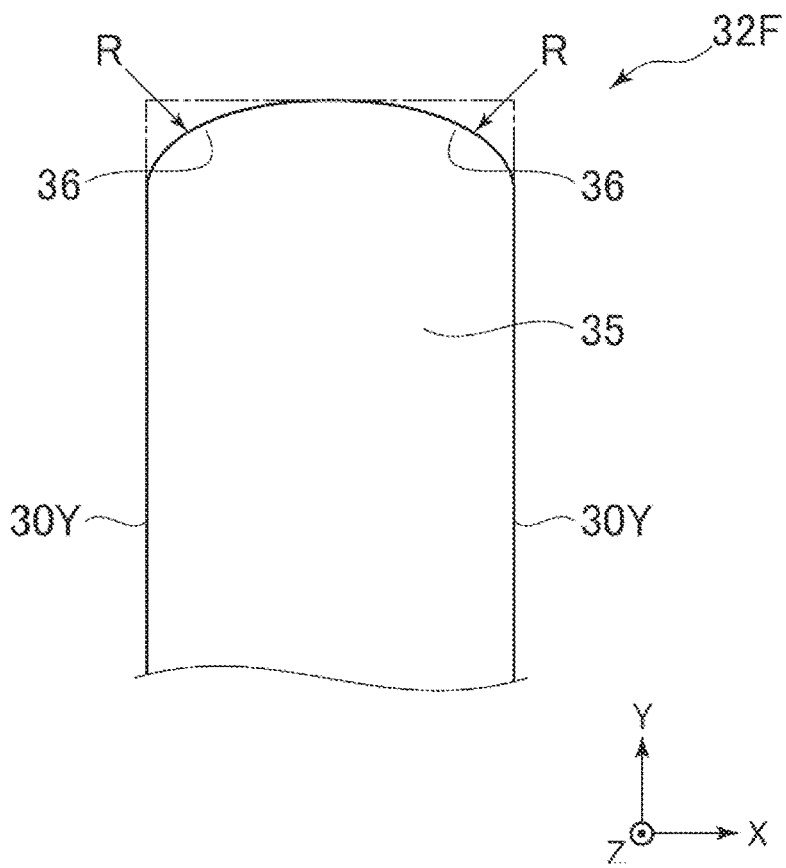
FIGS. 10A to 10J are enlarged views of end portions of soft magnetic bodies according to first to tenth modifications with regard to the long axis thereof, respectively.

Further, corners 36 of each shield 32, 32 are C-chamfered in the first embodiment (see FIG. 1D), and corners 36 of each shield 32A, 34A are C-chamfered and further R-chamfered at both ends thereof in the second embodiment (see FIG. 5A). However, end portion 35 may be formed into a shape that is different from the shape of each embodiment as long as the above-mentioned effect is obtained by removing unnecessary magnetic domains at end portion 35. For example, as shown in FIG. 10A, shield 32F according to a first modification may have end portion 35 that is R-chamfered along the entire width of the short side, as viewed in the Z axis direction. Shield 32F according to the first modification has a chamfered corner, as viewed in the Z axis direction, and has a circumference that is at least partly formed of a curved line, as viewed in the Z axis direction.

Figure 10B:
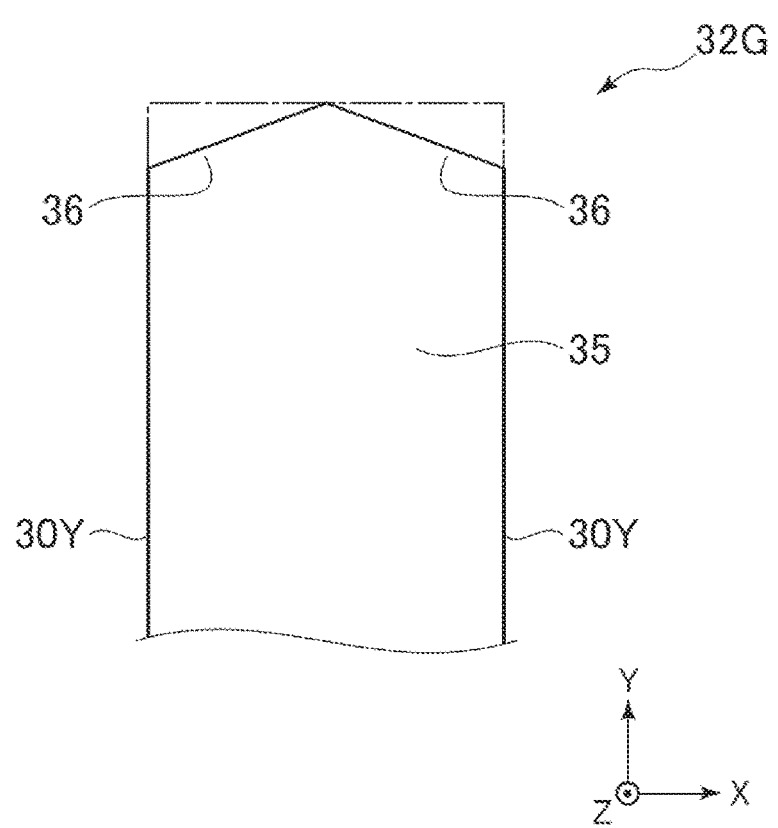

Further, as shown in FIG. 10B, each corner 36 of shield 32G according to a second modification may be formed such that there is not short side 30X disappears (or almost disappears), as viewed in the Z axis direction. Shield 32G according to the second modification has a chamfered corner, as viewed in the Z axis direction, and has an obtuse angle on at least a part of the circumference thereof, as viewed in the Z axis direction.

Figure 10C:
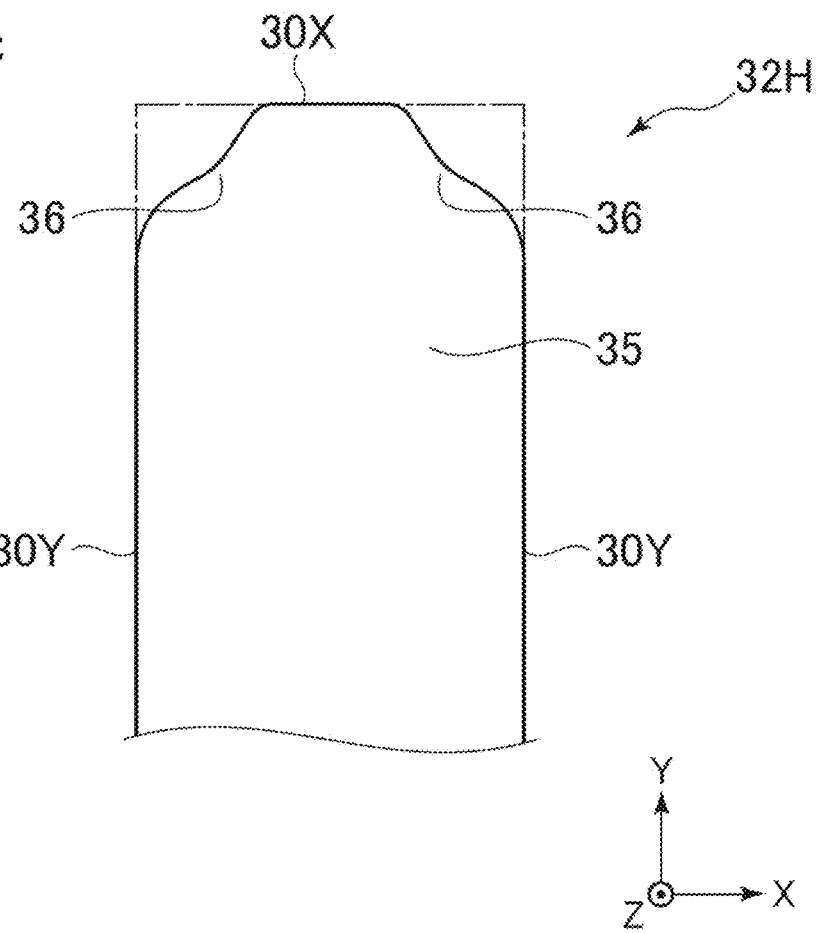

Further, as shown in FIG. 10C, shield 32H according to a third modification may have a chamfered part that is formed only of a curved line (a curve having an inflection point in this modification), as viewed in the Z axis direction. Shield 32H according to the third modification has a chamfered corner, as viewed in the Z axis direction, and has a circumference that is at least partly formed of a curved line, as viewed in the Z axis direction.

Figure 10D:
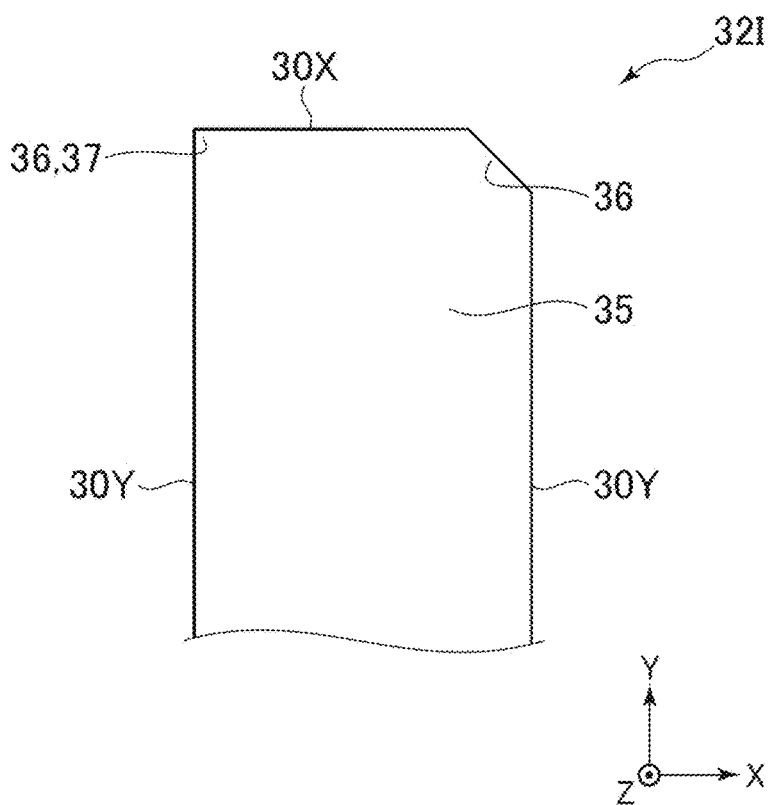

Further, as shown in FIG. 10D, shield 32I according to a fourth modification may have at least one corner that is not chamfered (that has apex portion 37) and at least one chamfered corner, as viewed in the Z axis direction. Shield 32I according to the fourth modification has at least one chamfered corner, as viewed in the Z axis direction, and has a circumference that is at least partly formed of a curved line, as viewed in the Z axis direction.

Figure 10E:
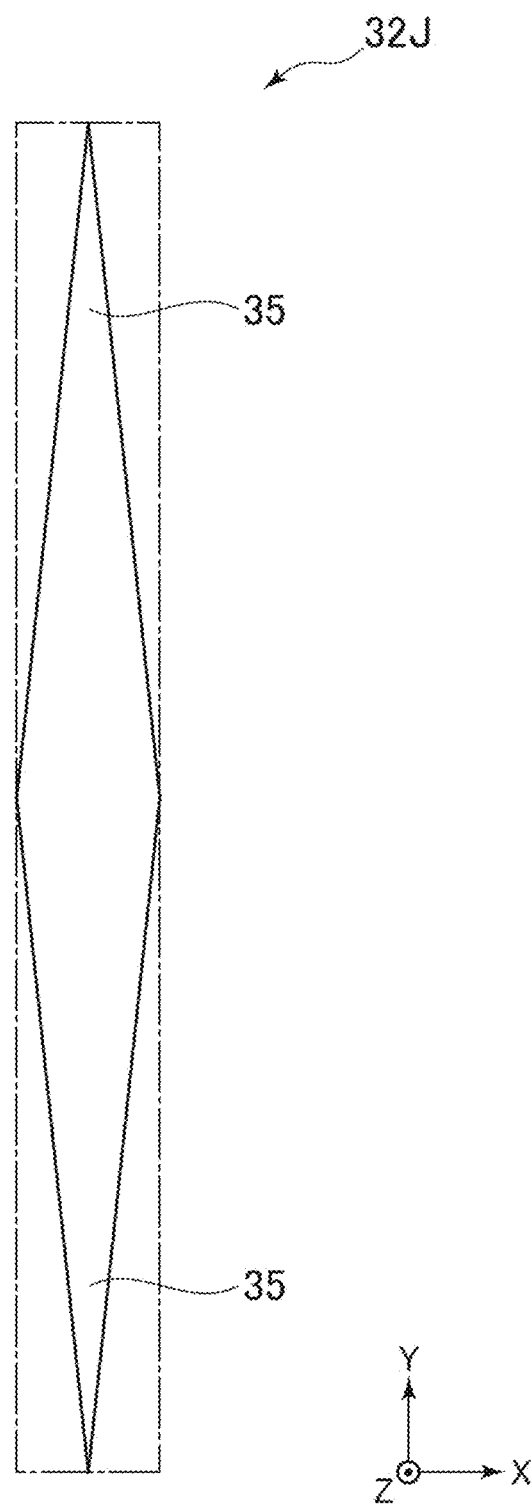

Further, as shown in FIG. 10E, shield 32J according to the fifth modification may be chamfered into a rhombic shape such that short sides 30X and long sides 30Y in the first embodiment disappear, as viewed in the Z axis direction. Shield 32J according to the fifth modification has a chamfered corner, as viewed in the Z axis direction, and has an obtuse angle on at least a part of the circumference thereof, as viewed in the Z axis direction. It should be noted that chamfering area S of this modification is defined to be an area of the region that is surrounded by a rectangular that passes through each corner, or the rectangular that is depicted with the dot-dash line in the figure, and shield 32J.

Figure 10F:
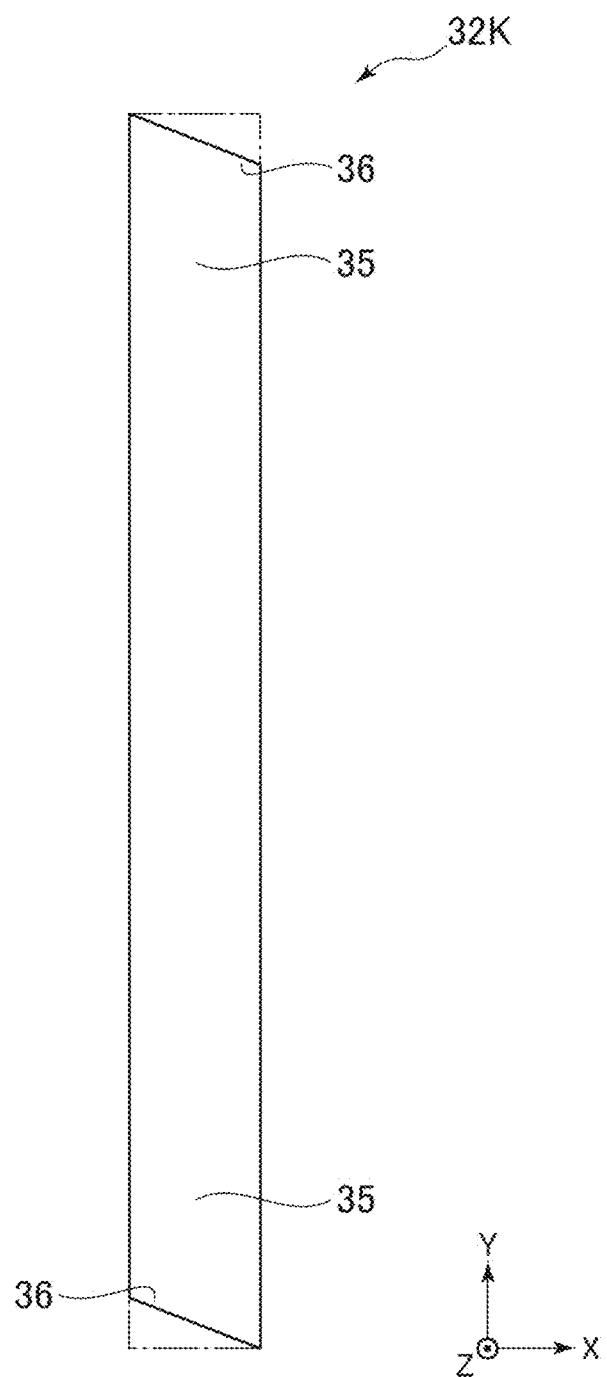

Further, as shown in FIG. 10F, shield 32K according to a sixth modification may be chamfered into a parallelogram such that short sides 30X in the first embodiment disappear, as viewed in the Z axis direction. Shield 32K according to the sixth modification has a chamfered corner, as viewed in the Z axis direction, and has an obtuse angle on at least a part of the circumference thereof, as viewed in the Z axis direction. It should be noted that chamfering area S of this modification is defined to be an area of the region that is surrounded by a rectangular that is formed by the lines that extend from one end to the other end of shield 32K in the Y axis direction and the lines that extend from one end to the other end of shield 32K in the X axis direction, or the rectangular that is depicted with the dot-dash line in the figure and shield 32K.

Figure 10G:
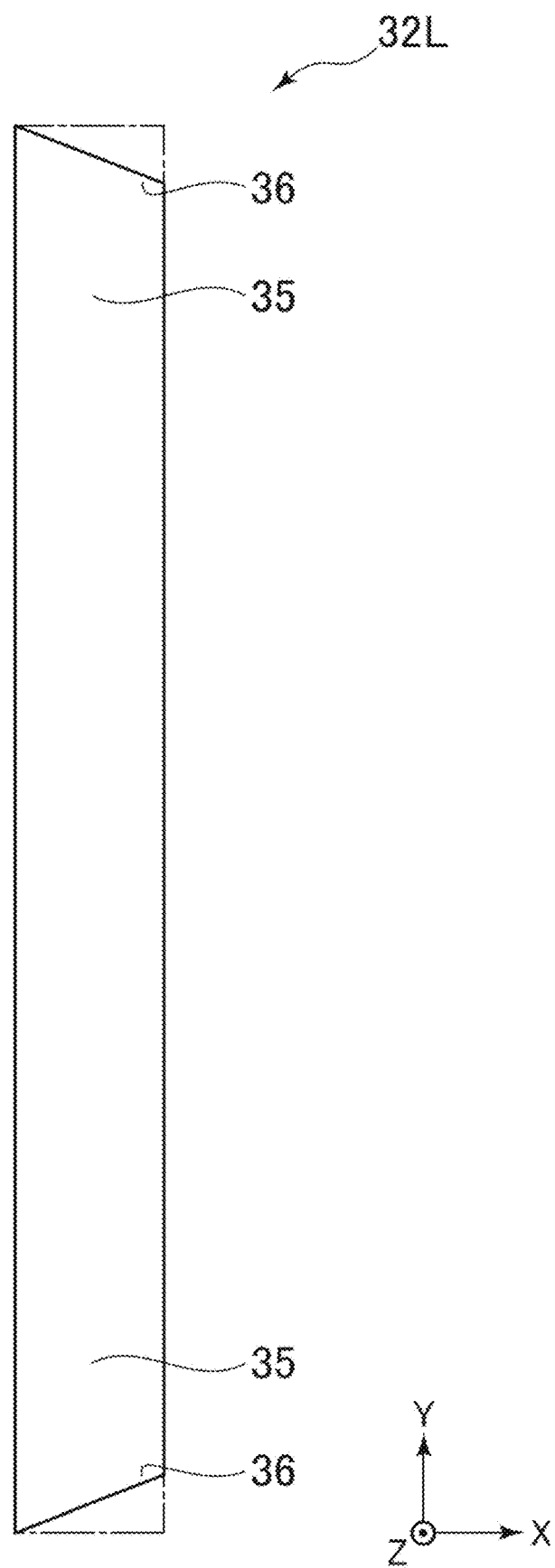
Figure 10H:
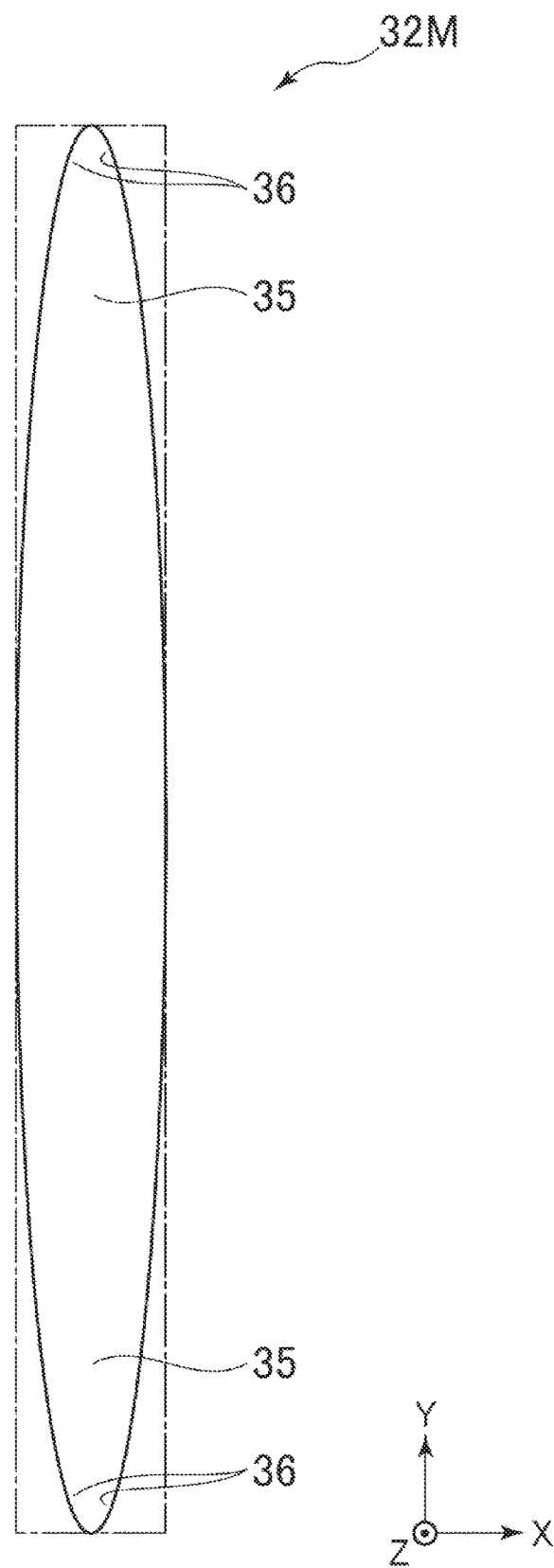

Further, as shown in FIG. 10G, shield 32L according to a seventh modification may be chamfered into a trapezoid such that short sides 30X in the first embodiment disappear, as viewed in the Z axis direction. Shield 32L according to the seventh modification has a chamfered corner, as viewed in the Z axis direction, and has an obtuse angle on at least a part of the circumference thereof, as viewed in the Z axis direction. It should be noted that chamfering area S of this modification is defined to be an area of the region that is surrounded by a rectangular that is formed by the lines (the line of the longer side) that extend from one end to the other end of shield 32K in the Y axis direction and the lines (the line in the height direction) that extend from one end to the other end of shield 32K in the X axis direction, or the rectangular that is depicted with the dot-dash line in the figure and shield 32L.

Figure 10I:
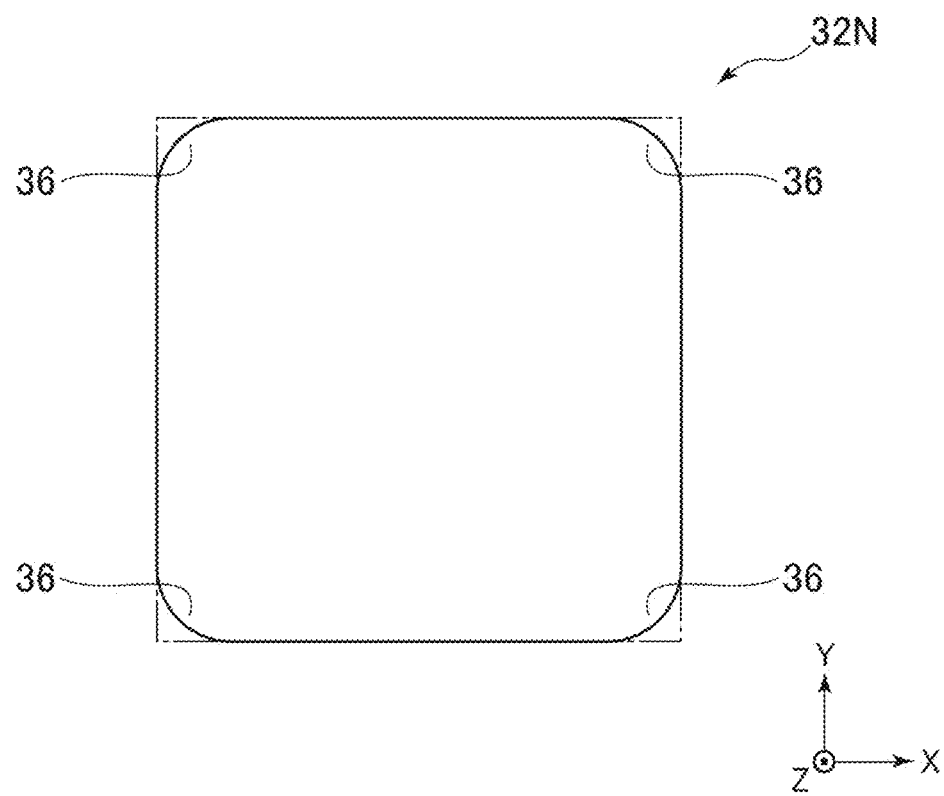

Further, as shown in FIG. 10I, shield 32M according to an eighth modification may be chamfered into an ellipse such that short sides 30X and long sides 30Y in the first embodiment disappear, as viewed in the Z axis direction. Shield 32M according to the eighth modification has a chamfered corner, as viewed in the Z axis direction, and has a circumference that is at least partly formed of a curved line, as viewed in the Z axis direction. It should be noted that chamfering area S of this modification is defined to be an area of the region that is surrounded by a rectangular that is defined by the major axis and minor axis of shield 32M, or the rectangular that is depicted with the dot-dash line in the figure and shield 32M.

In each embodiment and each modification, each shield is elongate. However, the shield may have a shape other than an elongate shape as long as the above-mentioned effect is obtained by removing unnecessary magnetic domains at the end portion. For example, as shown in FIG. 10I, shield 32N according to a ninth modification may have a square shape having the same lengths both in the X axis direction and in the Y axis direction, as viewed in the Z axis direction. Shield 32N according to the ninth modification has a chamfered corner, as viewed in the Z axis direction, and has a circumference that is at least partly formed of a curved line, as viewed in the Z axis direction. In this modification, chamfering area S may be calculated in the same manner as the embodiments mentioned above.

Figure 10J:
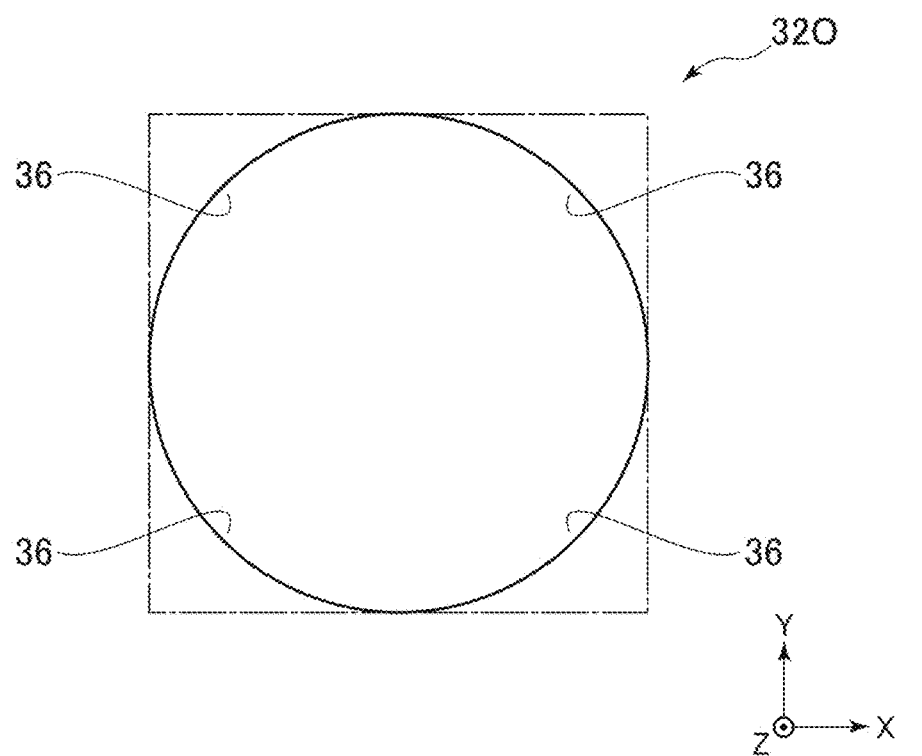

In each embodiment and each modification, each shield is rectangular. However, the shield may have a shape other than a rectangular shape as long as the above-mentioned effect is obtained by removing unnecessary magnetic domains at the end portion. For example, as shown in FIG. 10J, shield 32O according to a tenth modification may have a circle shape having the same lengths in the X axis direction and in the Y axis direction, as viewed in the Z axis direction. Shield 32O according to the tenth modification has a chamfered corner, as viewed in the Z axis direction, and has a circumference that is at least partly formed of a curved line, as viewed in the Z axis direction. It should be noted that chamfering area S of this modification is defined to be an area of the region that is surrounded by a square that is surrounded by four line having a length that is equal to the diameter of shield 32O, or the rectangular that is depicted with the dot-dash line in the figure and shield 32O.

It should be noted that the first to tenth modifications may also be applied to yokes 32D, 32E etc. of the fourth and fifth embodiments.

In each embodiment, chamfering area S that is defined in the description is S1 ($\mu m^2$) or more and S2 ($\mu m^2$) or less. Here, S1 is $1.0 \times 10^{-3}$, and S2 is $2.5 \times 10$. Instead of the above, for example, a distance between intersection IS (see FIG. 1D) and corner 36 on a normal line of corner 36 that pass through intersection IS may be defined to be distance d, as viewed in the Z axis direction. Suppose that distance d that corresponds to chamfering area S1 ($\mu m^2$) is distance d1 ($\mu m$) and distance d that corresponds to chamfering area S2 ($\mu m^2$) is distance d2 ($\mu m$). Then, it is possible to say in each embodiment and each modification that distance d should be d1 ($\mu m$) or more and d2 ($\mu m$) or less. Distance d1 is $1.0 \times 10^{-3}$, and distance d2 is 5.0.

In the fourth embodiment, each yoke 32D, 34D collects a magnetic field in the Y axis direction and guides the magnetic field that is collected in the Y axis direction (see FIGS. 7A and 7B). In fifth embodiment, each yoke 32E, 34E collects magnetic field in the Z axis direction and guides the magnetic field that is collected in the Y axis direction (see FIGS. 9A and 9B). However, each yoke 32D, 34D and each yoke 32E, 34E may collects a magnetic field in the X axis direction and guides the magnetic field that is collected in the X axis direction. It is needless to say that an arrangement in which a magnetic field in a direction other than the fourth and fifth embodiments is collected and the magnetic field that is collected is guided in a different direction is included in the scope of the present invention.

In each embodiment, the spacer layer that constitutes element portion 20 is a tunneling barrier layer, and element portion 20 is a TMR element. However, the spacer layer that constitutes element portion 20 may be a nonmagnetic conductive layer that is formed of a nonmagnetic metal, such as Cu, in order to form element portion 20 as a giant magnetoresistive element (GMR element). Element portion 20 may also be an anisotropic magnetoresistive element (AMR element).

Each embodiment has been described by taking a position sensor as an example. However, a magnetic sensor may be a sensor other than a positon sensor. For example, a magnetic sensor may be a compass that detects terrestrial magnetism, an angle sensor, an encoder and so on.

It is needless to say that an embodiment in which one among the embodiments mentioned above, the modification thereof and the first to fourth modifications is combined with an element (or idea) of other embodiments is included in the scope of the present invention.

Although certain preferred embodiments of the present invention have been shown and described in detail, it should be understood that various changes and modifications may be made without departing from the spirit or scope of the appended claims.

What is claimed is:

1. A magnetic sensor comprising:
   a plurality of magnetoresistive elements; and
   a plurality of pairs of soft magnetic bodies that shield a magnetic field that is applied to the magnetoresistive elements, wherein
   each soft magnetic body includes two pairs of straight sides and at least one sloping side, which is located between two adjacent ones of the straight sides, such that the sloping side is sloped with respect to each of the adjacent ones of the straight sides, as viewed in a film thickness direction of the plurality of magnetoresistive elements,
   the magnetoresistive elements has a plurality of groups each including more than one of the magnetoresistive elements, the magnetoresistive elements of each group are arranged in an aligning direction, and the groups are arranged in a direction perpendicular both to the aligning direction and to the film thickness direction, and
   each pair of the soft magnetic bodies is arranged to face opposite sides of a corresponding one of the magnetoresistive elements in the film thickness direction and such that the pairs of soft magnetic bodies are arranged in the direction perpendicular both to the aligning direction and to the film thickness direction.

2. A magnetic sensor comprising:
a plurality of magnetoresistive elements; and
a plurality of soft magnetic bodies that shield a magnetic field that is applied to the magnetoresistive elements, wherein
each soft magnetic body includes two pairs of straight sides and at least one sloping side, which is located between two adjacent ones of the straight sides, such that the sloping side is sloped with respect to each of the adjacent ones of the straight sides, as viewed in a film thickness direction of the plurality of magnetoresistive elements,
the magnetoresistive elements has a plurality of groups each including more than one of the magnetoresistive elements, the magnetoresistive elements of each group are arranged in an aligning direction, and the groups are arranged in a direction perpendicular both to the aligning direction and to the film thickness direction, and
each soft magnetic body is arranged to face one of opposite sides of a corresponding one of the magnetoresistive elements in the film thickness direction and such that the soft magnetic bodies are arranged in the direction perpendicular both to the aligning direction and to the film thickness direction.

3. A magnetic sensor comprising:
a magnetoresistive element; and
a pair of soft magnetic bodies, which is a pair of yokes wherein the soft magnetic bodies are arranged on both sides of the magnetoresistive element in a direction perpendicular to a film thickness direction of the magnetoresistive element, wherein
each magnetoresistive element has a magnetically sensitive axis direction along which a change in magnetic field is detected, and the soft magnetic bodies are arranged on both sides of the magnetoresistive element in the magnetically sensitive axis direction, and
each soft magnetic body includes two pairs of straight sides and at least one sloping side, which is located between two adjacent ones of the straight sides, such that the sloping side is sloped with respect to each of the adjacent ones of the straight sides, as viewed in the film thickness direction.

4. A magnetic sensor comprising:
a magnetoresistive element; and
at least one soft magnetic body, which is at least one yoke wherein the soft magnetic body is arranged near the magnetoresistive element, wherein
each soft magnetic body of the at least one soft magnetic body includes two pairs of straight sides and at least one sloping side, which is located between two adjacent ones of the straight sides, such that the sloping side is sloped with respect to each of the adjacent ones of the straight sides, as viewed in a film thickness direction of the magnetoresistive element,
further comprising a plurality of magnetoresistive elements including the magnetoresistive element, wherein
the magnetoresistive elements have a plurality of groups each including more than one of the magnetoresistive elements, the magnetoresistive elements of each group are arranged in an aligning direction, and the groups are arranged in a direction perpendicular both to the aligning direction and to the film thickness direction, and
the at least one soft magnetic body is a plurality of soft magnetic bodies, wherein the soft magnetic bodies are arranged near the magnetoresistive elements, wherein the soft magnetic bodies are arranged in the direction perpendicular both to the aligning direction and to the film thickness direction.

5. A magnetic sensor comprising:
a magnetoresistive element; and
at least one soft magnetic body, which is at least one yoke wherein the soft magnetic body is arranged near the magnetoresistive element, wherein
each soft magnetic body of the at least one soft magnetic body includes two pairs of straight sides and at least one sloping side, which is located between two adjacent ones of the straight sides, such that the sloping side is sloped with respect to each of the adjacent ones of the straight sides, as viewed in a film thickness direction of the magnetoresistive element, and
wherein an area of a region that is enclosed by the sloping side and respective extensions of the two adjacent ones of the straight sides is $1.0 \times 10^{-3}$ ($\mu m^2$) or more and $2.5 \times 10$ ($\mu m^2$) or less, as viewed in the film thickness direction,
the magnetoresistive element has a magnetically sensitive axis direction along which a change in magnetic field is detected, and has opposite sides in the magnetically sensitive axis direction, and
the at least one soft magnetic body is arranged on a respective one side of the opposite sides of the magnetoresistive element, (i) laterally spaced apart from the magnetoresistive element in the magnetically sensitive axis direction or (ii) diagonally spaced apart from the respective one side in a direction inclined relative to the magnetically sensitive axis direction.

6. The magnetic sensor according to claim 5, wherein each sloping side of the soft magnetic body is defined at least partially by a sloping line, as viewed in the film thickness direction.

7. The magnetic sensor according to claim 5, wherein the sloping side is defined only by a straight line, as viewed in the film thickness direction.

8. The magnetic sensor according to claim 5, wherein the sloping side is defined only by a curved line, as viewed in the film thickness direction.

9. The magnetic sensor according to claim 5, wherein the sloping side is defined by a combination of a curved line and a straight line, as viewed in the film thickness direction.

10. The magnetic sensor according to claim 5, wherein the sloping side is defined by the straight line and two curved lines that are connected to opposite ends of the straight line, respectively, as viewed in the film thickness direction.

11. The magnetic sensor according to claim 5, further comprising a plurality of magnetoresistive elements including the magnetoresistive element, wherein
the magnetoresistive elements has a plurality of groups each including more than one of the magnetoresistive elements, the magnetoresistive elements of each group are arranged in an aligning direction, and the groups are arranged in a direction perpendicular both to the aligning direction and to the film thickness direction, and
the at least one soft magnetic body is a plurality of soft magnetic bodies, wherein the soft magnetic bodies are arranged near the magnetoresistive elements, wherein the soft magnetic bodies are arranged in the direction perpendicular both to the aligning direction and to the film thickness direction.

12. The magnetic sensor according to claim 5, wherein the at least one soft magnetic body is arranged laterally spaced apart from the respective one side of the magnetoresistive element in the magnetically sensitive axis direction of the magnetoresistive element, the magnetoresistive element has a long axis, and a line parallel to the magnetically sensitive axis direction of the magnetoresistive element is parallel to the long axis.

13. The magnetic sensor according to claim 5, wherein the at least one soft magnetic body is arranged diagonally spaced apart from the respective one side in a direction inclined relative to the magnetically sensitive axis direction of the magnetoresistive element, the magnetoresistive element has a long axis, and a line parallel to the magnetically sensitive axis of the magnetoresistive element is perpendicular to the long axis.

14. A magnetic sensor comprising:
   a magnetoresistive element; and
   at least one soft magnetic body, which is at least one yoke wherein the soft magnetic body is arranged near the magnetoresistive element, wherein
   each soft magnetic body of the at least one soft magnetic body includes two pairs of straight sides and at least one sloping side, which is located between two adjacent ones of the straight sides, such that the sloping side is sloped with respect to each of the adjacent ones of the straight sides, as viewed in a film thickness direction of the magnetoresistive element, and
   wherein a distance between an intersection of respective extensions of the two adjacent ones of the straight sides and the sloping side is $1.0 \times 10^{-3}$ (μm) or more and 5.0 (μm) or less, as viewed in the film thickness direction,
   the magnetoresistive element has a magnetically sensitive axis direction along which a change in magnetic field is detected, and has opposite sides in the magnetically sensitive axis direction, and
   the at least one soft magnetic body is arranged on a respective one side of the opposite sides of the magnetoresistive element, (i) laterally spaced apart from the magnetoresistive element in the magnetically sensitive axis direction or (ii) diagonally spaced apart from the respective one side in a direction inclined relative to the magnetically sensitive axis direction.

15. The magnetic sensor according to claim 14, wherein each sloping side of the soft magnetic body is defined at least partially by a sloping line, as viewed in the film thickness direction.

16. The magnetic sensor according to claim 14, wherein the sloping side is defined only by a straight line, as viewed in the film thickness direction.

17. The magnetic sensor according to claim 14, wherein the sloping side is defined only by a curved line, as viewed in the film thickness direction.

18. The magnetic sensor according to claim 14, wherein the sloping side is defined by a combination of a curved line and a straight line, as viewed in the film thickness direction.

19. The magnetic sensor according to claim 14, wherein the sloping side is defined by the straight line and two curved lines that are connected to opposite ends of the straight line, respectively, as viewed in the film thickness direction.

20. The magnetic sensor according to claim 14, further comprising a plurality of magnetoresistive elements including the magnetoresistive element, wherein
   the magnetoresistive elements has a plurality of groups each including more than one of the magnetoresistive elements, the magnetoresistive elements of each group are arranged in an aligning direction, and the groups are arranged in a direction perpendicular both to the aligning direction and to the film thickness direction, and
   the at least one soft magnetic body is a plurality of soft magnetic bodies, wherein the soft magnetic bodies are arranged near the magnetoresistive elements, wherein the soft magnetic bodies are arranged in the direction perpendicular both to the aligning direction and to the film thickness direction.

21. The magnetic sensor according to claim 14, wherein the at least one soft magnetic body is arranged laterally spaced apart from the respective one side of the magnetoresistive element in the magnetically sensitive axis direction of the magnetoresistive element, the magnetoresistive element has a long axis, and a line parallel to the magnetically sensitive axis of the magnetoresistive element is parallel to the long axis.

22. The magnetic sensor according to claim 14, wherein the at least one soft magnetic body is arranged diagonally spaced apart from the respective one side in a direction inclined relative to the magnetically sensitive axis direction of the magnetoresistive element, the magnetoresistive element has a long axis, and a line parallel to the magnetically sensitive axis of the magnetoresistive element is perpendicular to the long axis.

* * * * *